United States Patent
Nakagawa

(10) Patent No.: US 8,154,075 B2
(45) Date of Patent: Apr. 10, 2012

(54) NONVOLATILE SEMICONDUCTOR MEMORY DEVICE AND METHOD FOR MANUFACTURING THE SAME

(75) Inventor: Kenichiro Nakagawa, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 164 days.

(21) Appl. No.: 12/698,533

(22) Filed: Feb. 2, 2010

(65) Prior Publication Data

US 2010/0193857 A1 Aug. 5, 2010

(30) Foreign Application Priority Data

Feb. 3, 2009 (JP) ................................ 2009-022952

(51) Int. Cl.
*H01L 29/66* (2006.01)

(52) U.S. Cl. ........ 257/331; 257/324; 257/326; 257/330; 257/E29.13; 257/E29.201

(58) Field of Classification Search .................. 257/324, 257/326, 330, 331, 332, 333, E29.03, E29.201, 257/E29.621, E29.624
See application file for complete search history.

(56) References Cited

U.S. PATENT DOCUMENTS

| | | | |
|---|---|---|---|
| 7,067,373 B2 * | 6/2006 | Shukuri | 438/257 |
| 7,504,689 B2 | 3/2009 | Hisamoto et al. | |
| 2006/0022260 A1 | 2/2006 | Hisamoto et al. | |
| 2009/0152619 A1 | 6/2009 | Hisamoto et al. | |

FOREIGN PATENT DOCUMENTS

JP 2006-041354 2/2006

* cited by examiner

*Primary Examiner* — Evan Pert
*Assistant Examiner* — Eduardo A Rodela
(74) *Attorney, Agent, or Firm* — Young & Thompson

(57) ABSTRACT

A split gate type nonvolatile semiconductor memory device having a FinFET structure includes a semiconductor substrate, parallel trenches on a surface of the semiconductor substrate, and select and memory gate electrodes perpendicular to the trenches. While either the select or the memory gate electrodes are formed prior to the other gate electrodes, each remaining gate electrode is formed adjacent to a side wall of each of the gate electrodes. The semiconductor memory device includes source/drain regions each formed between each pair of the select gate electrodes and between each pair of the memory gate electrodes in protruding portions between each pair of the trenches. A difference between heights of the select gate electrodes and the memory gate electrodes is equal to or greater than a difference between heights of insulation layers formed on the bottom of each of the trenches and the source/drain regions.

9 Claims, 52 Drawing Sheets

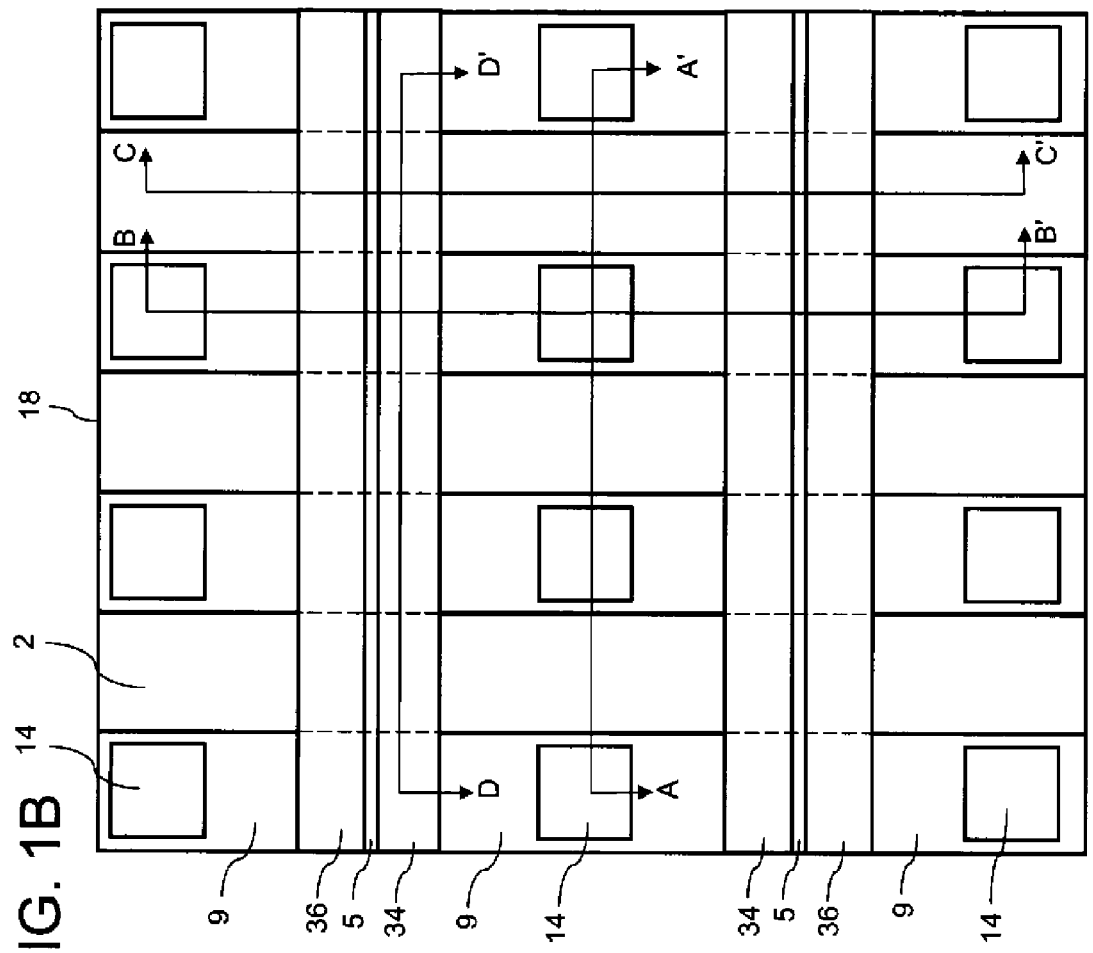
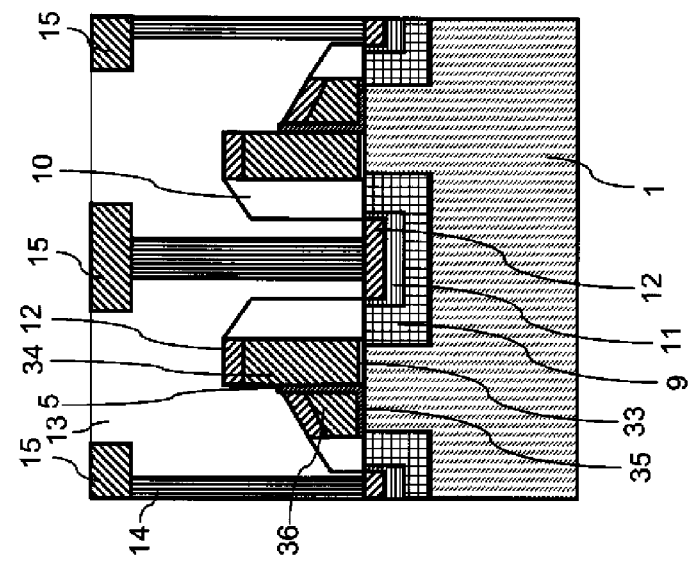

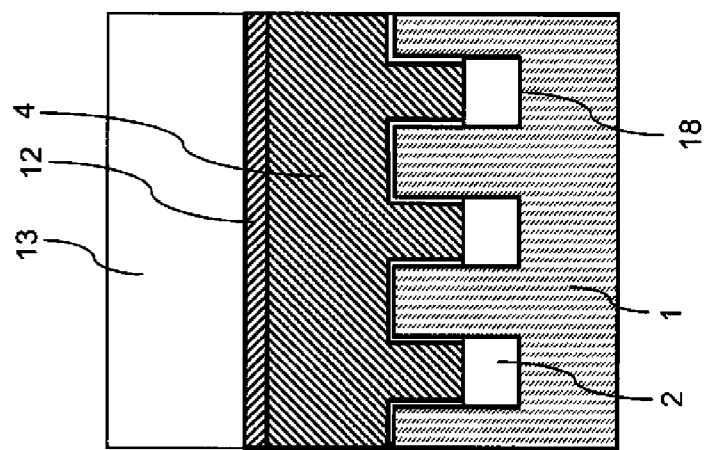
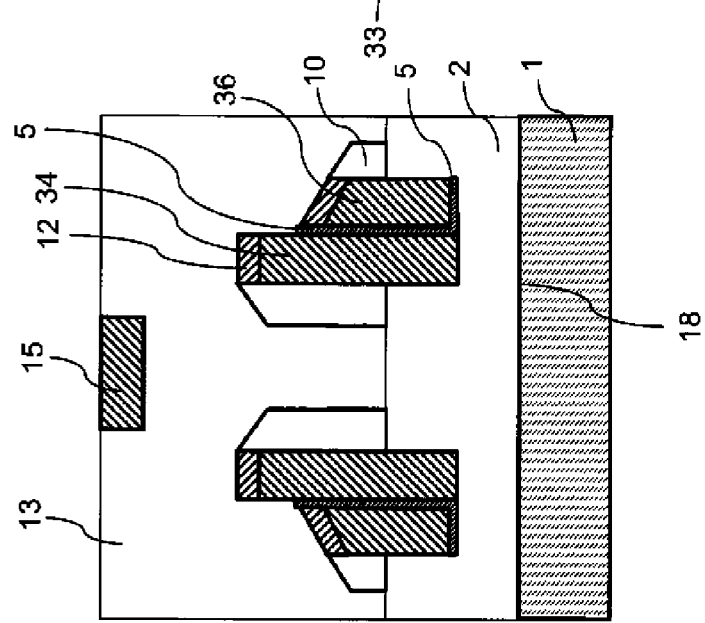
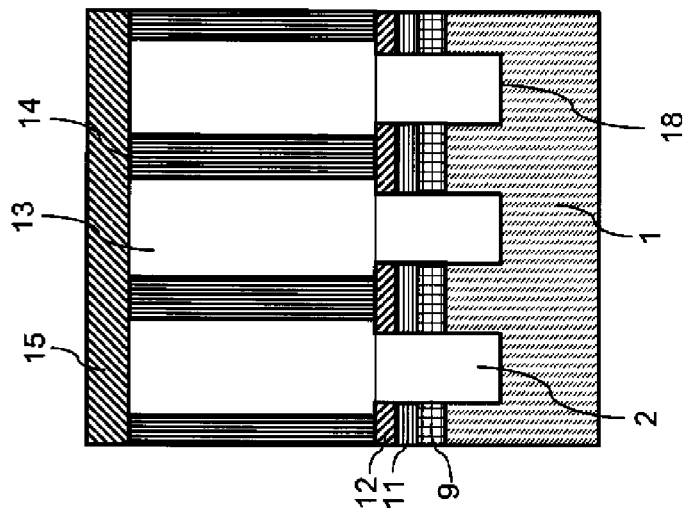

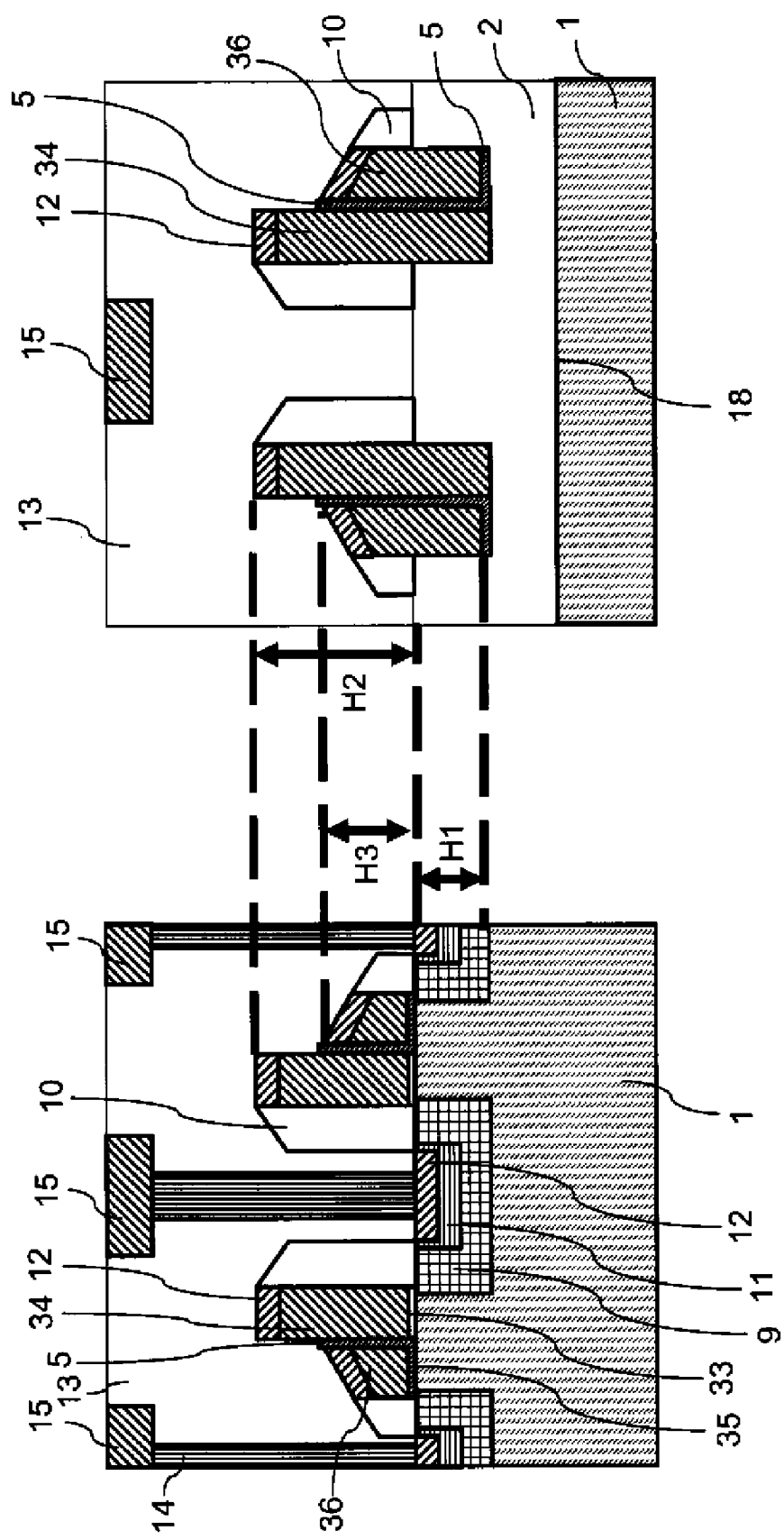

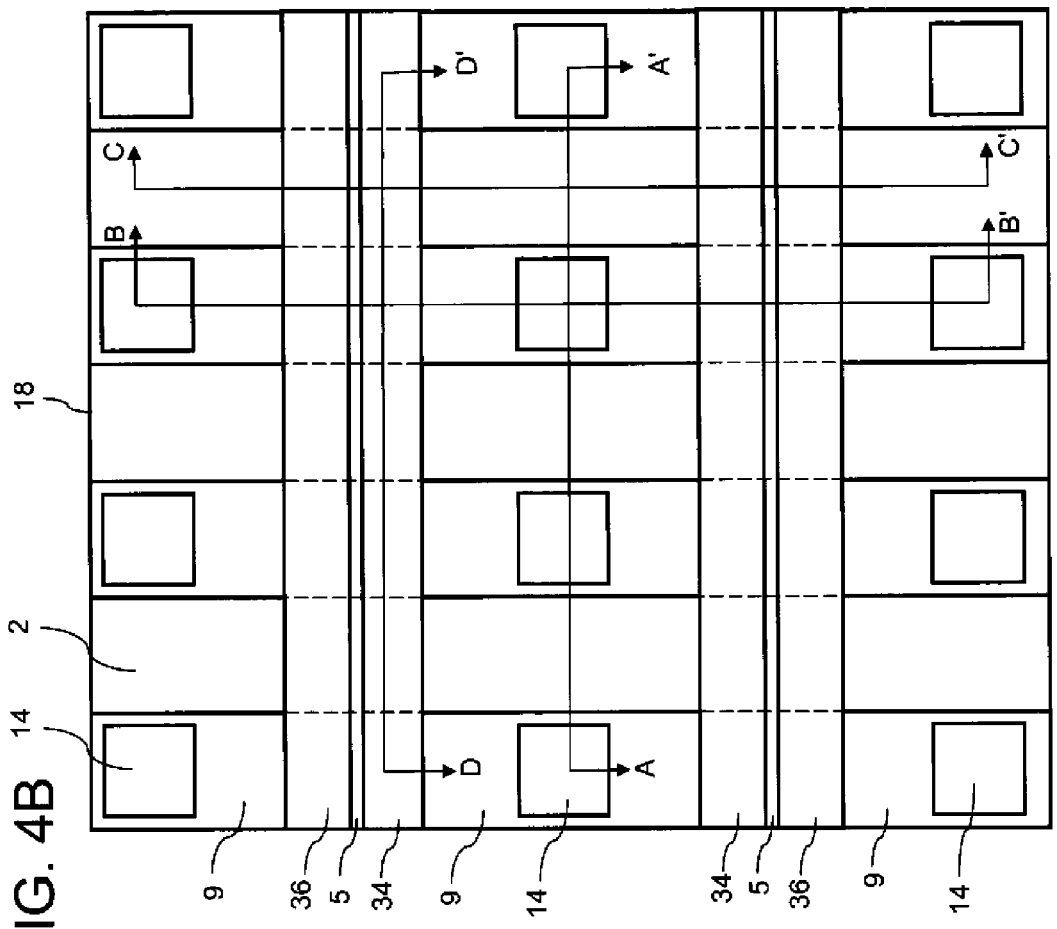

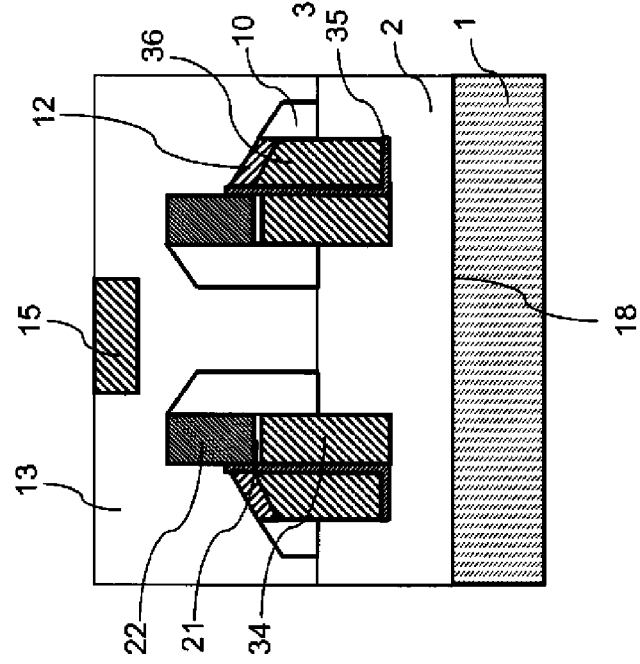
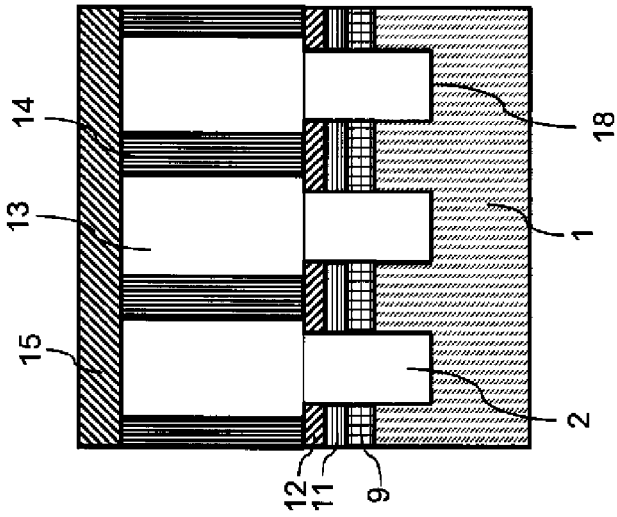

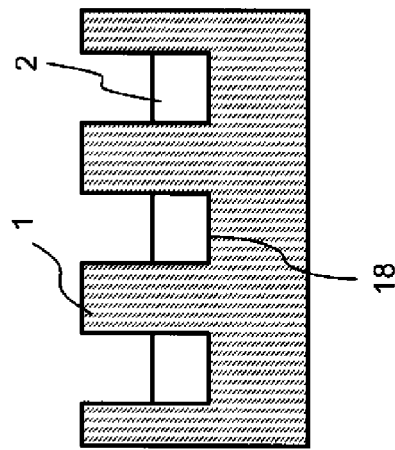
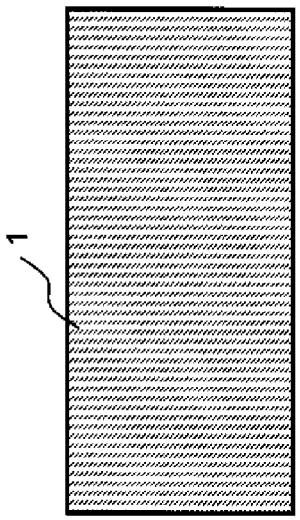
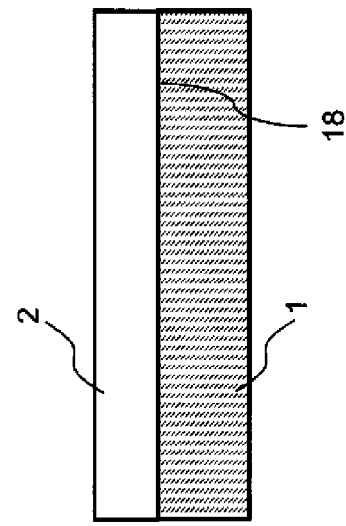

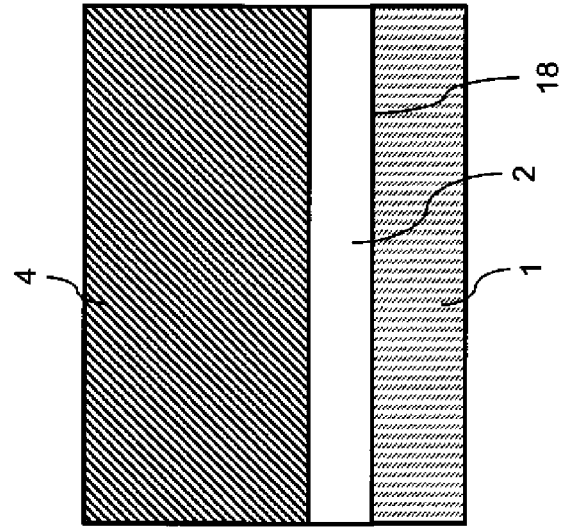
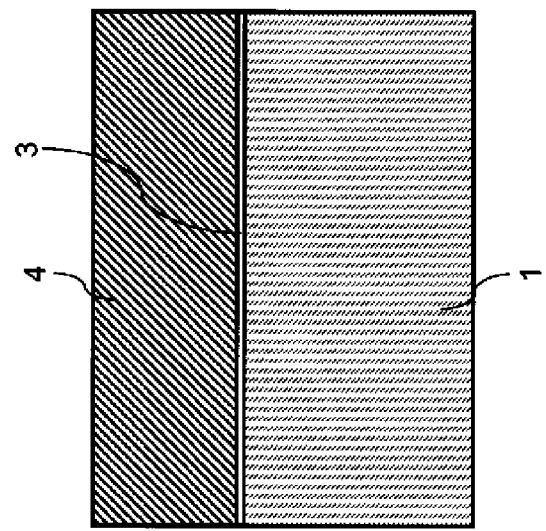
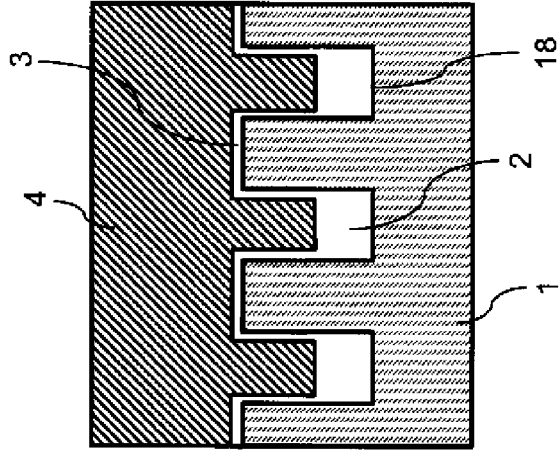

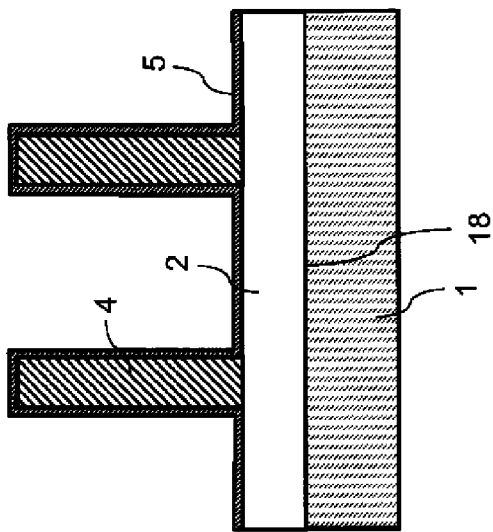
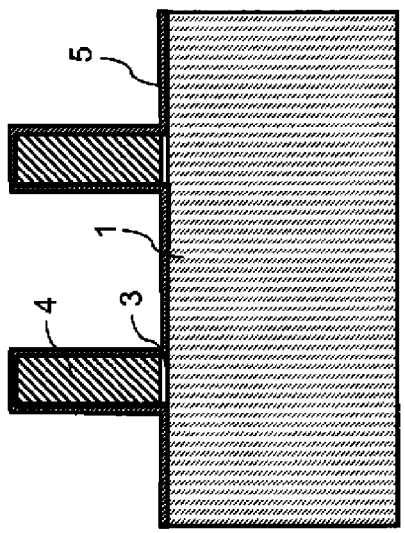
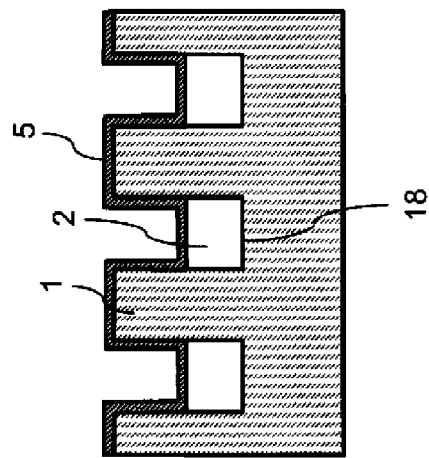

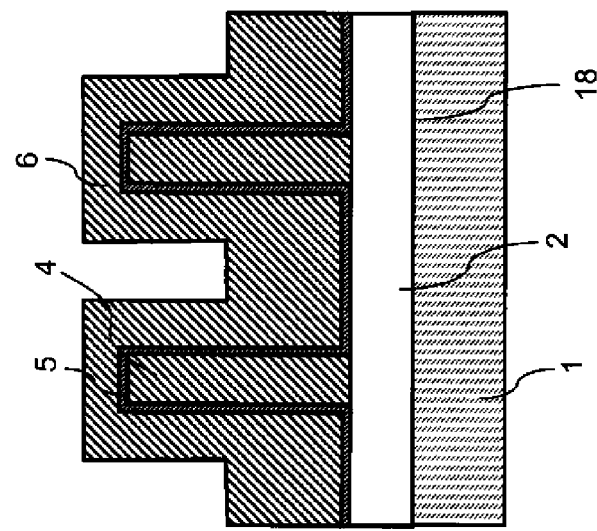
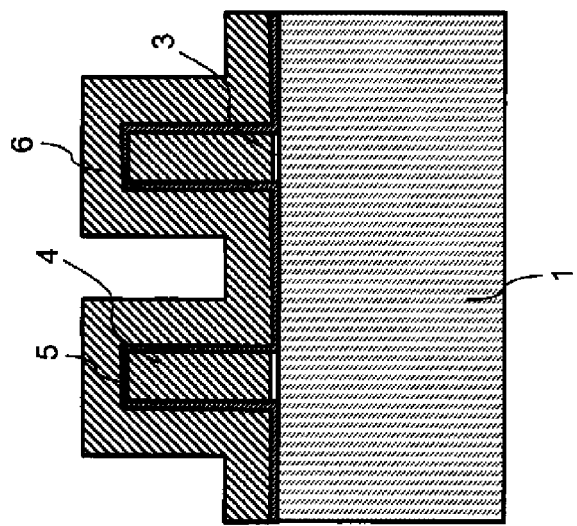
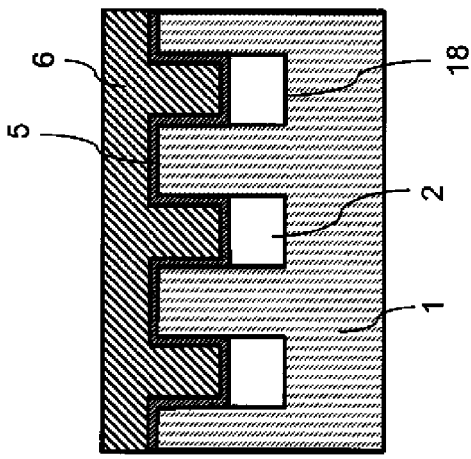

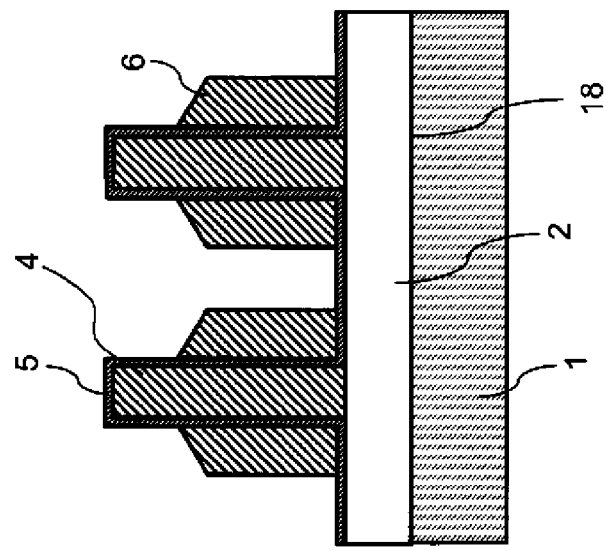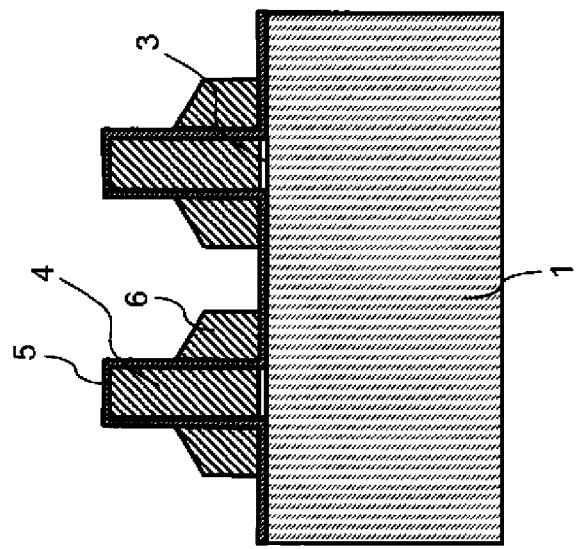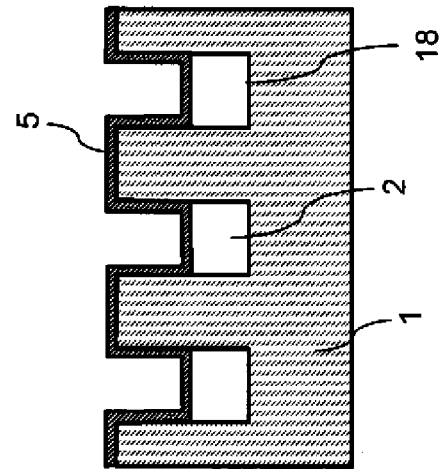

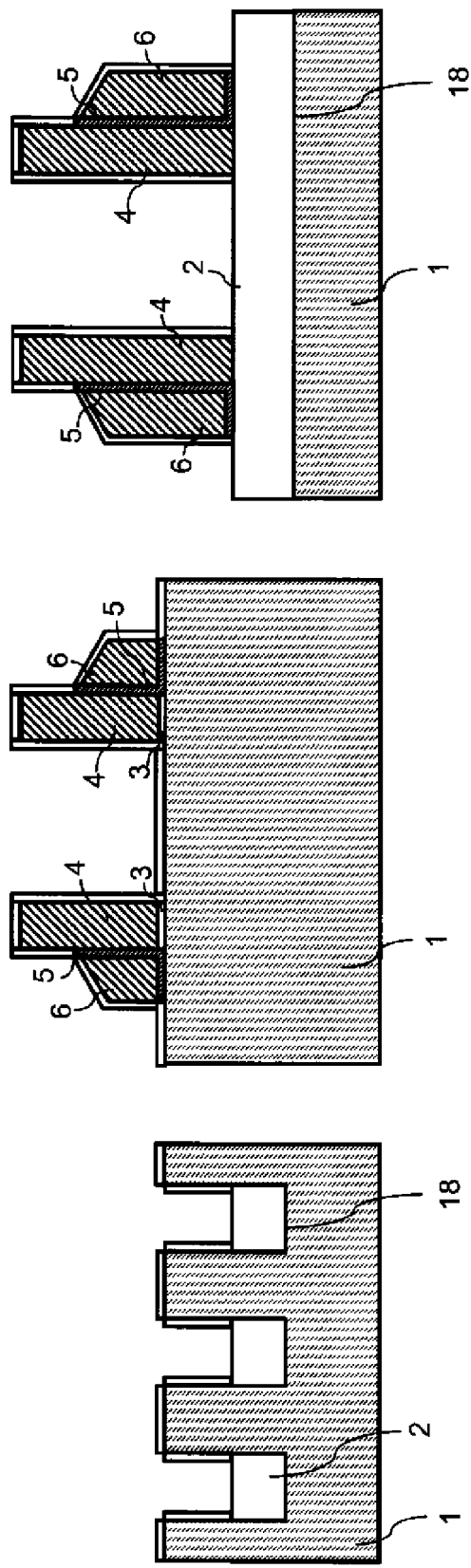

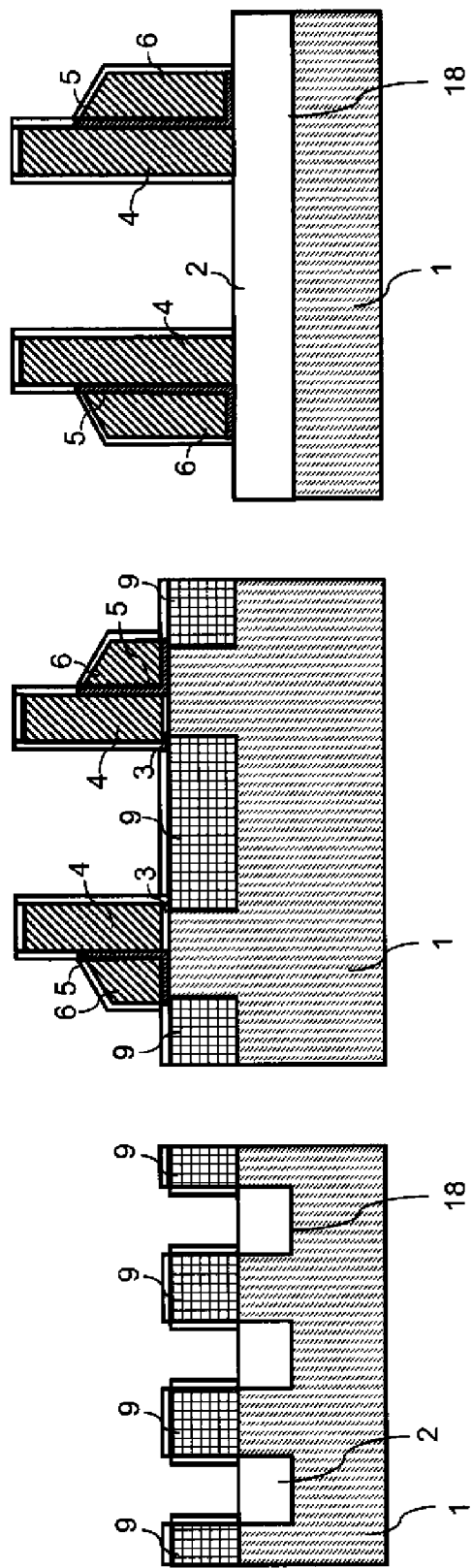

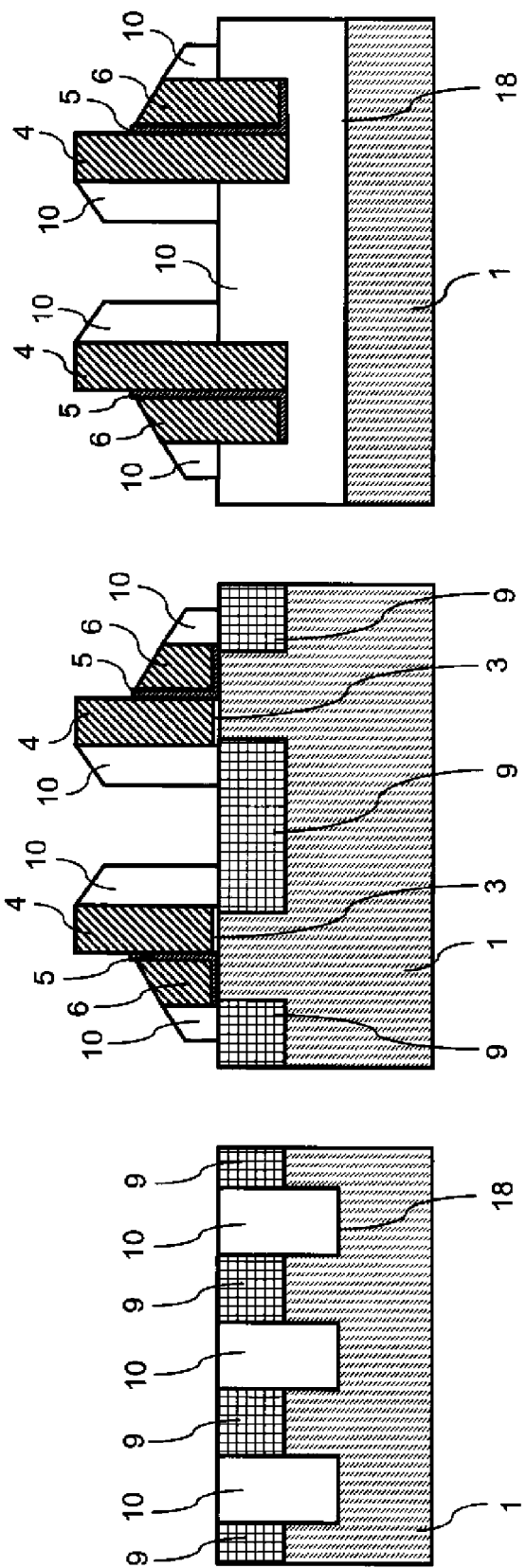

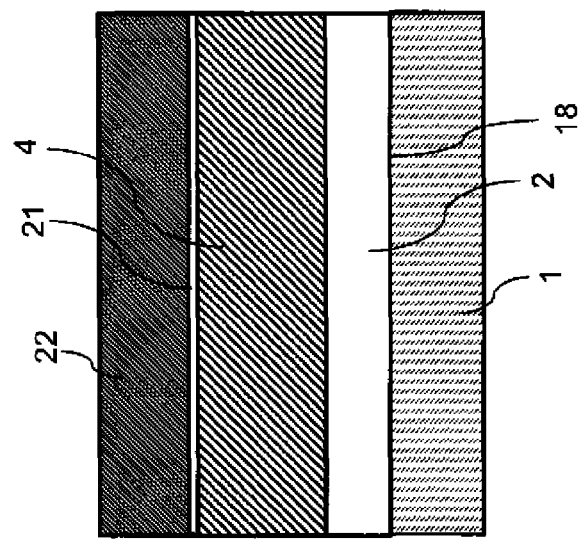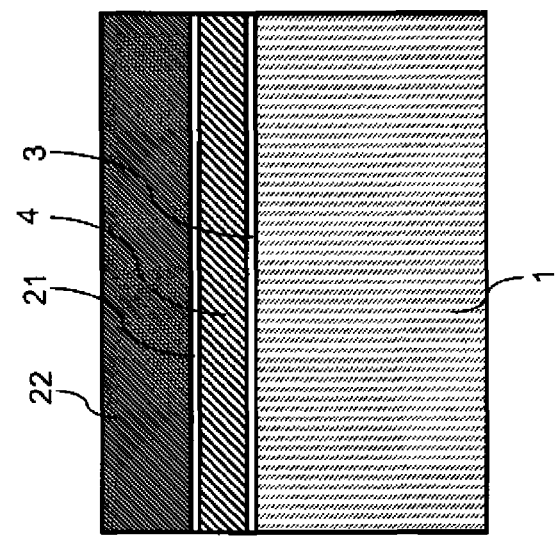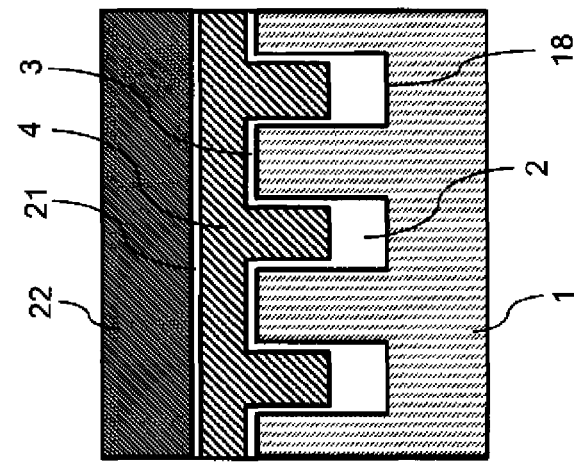

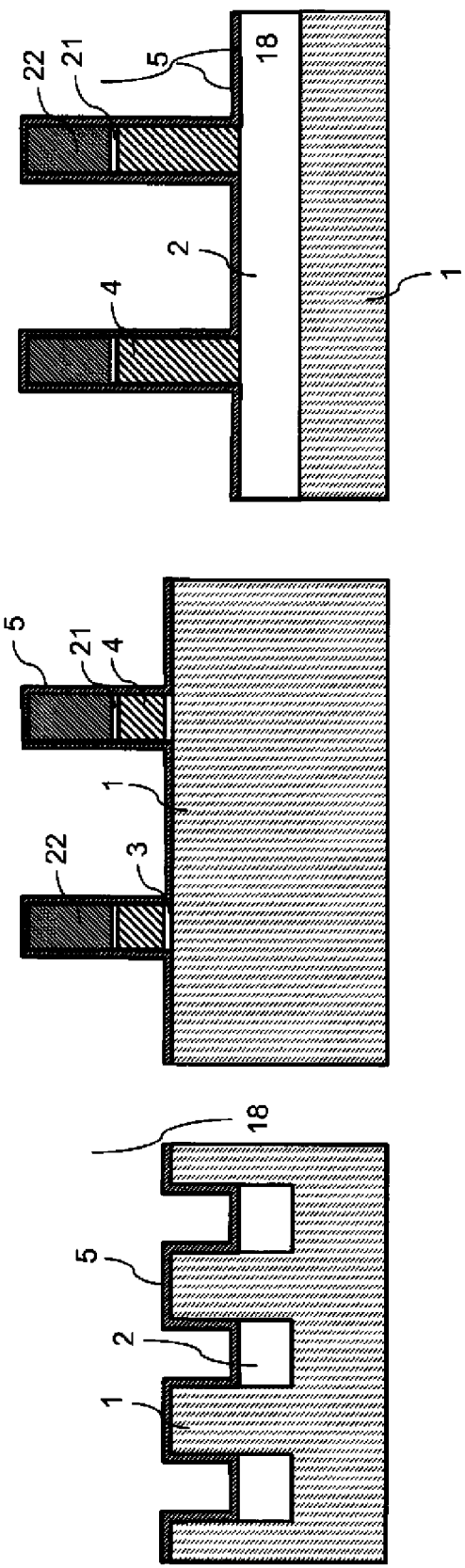

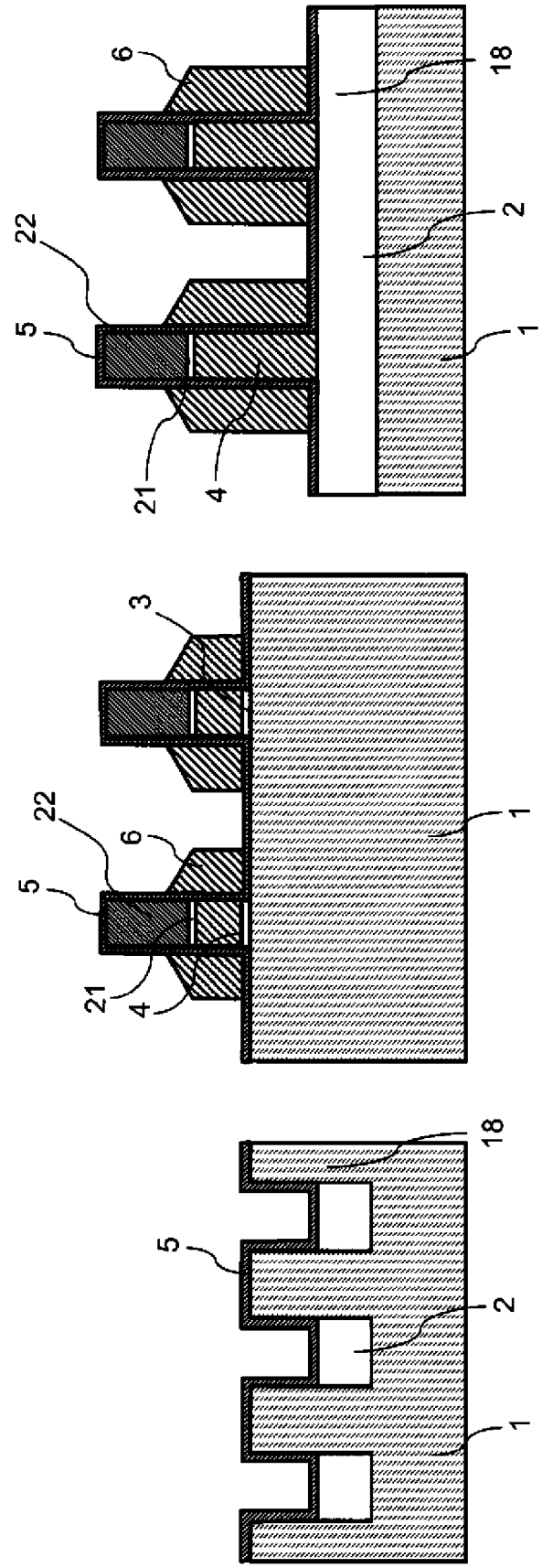

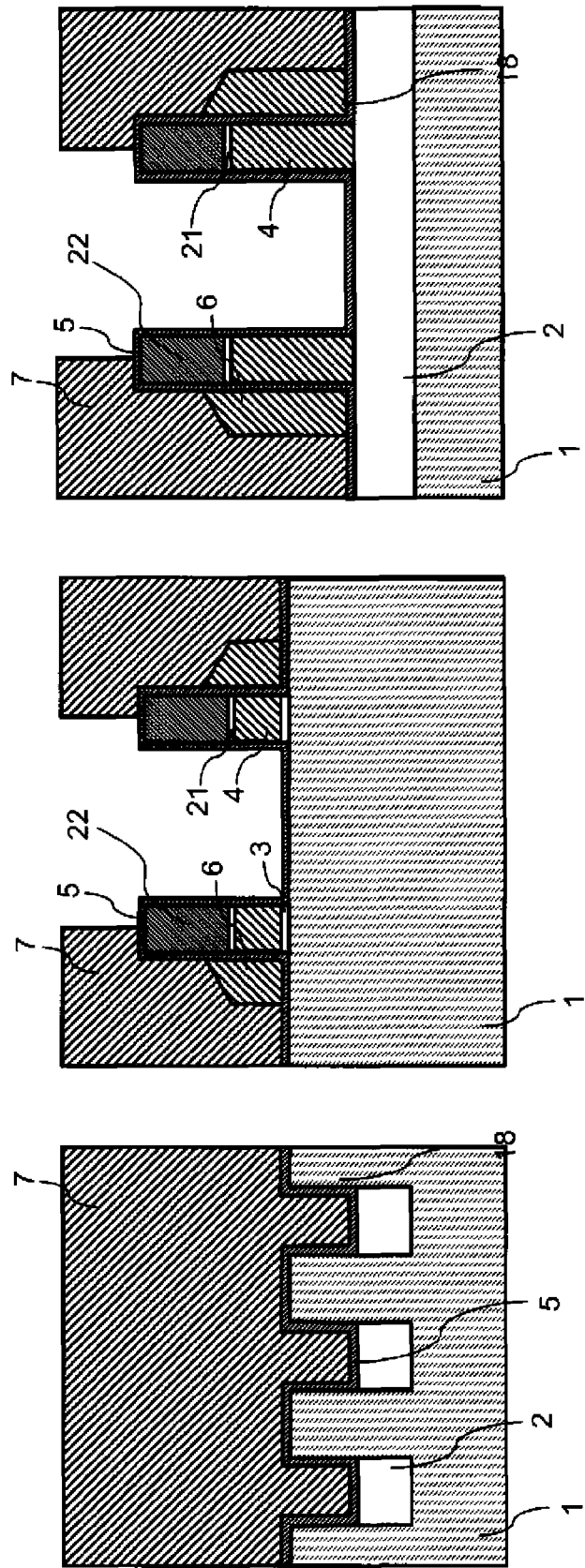

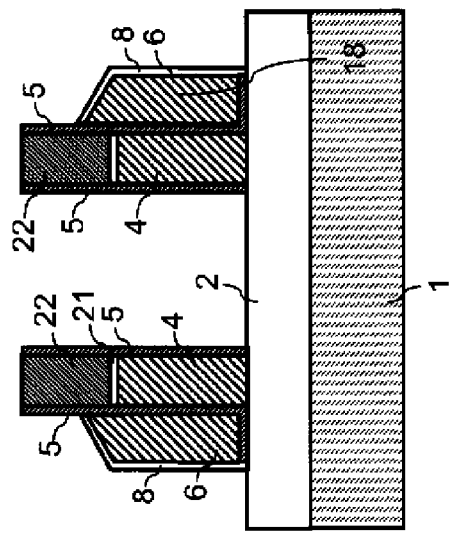
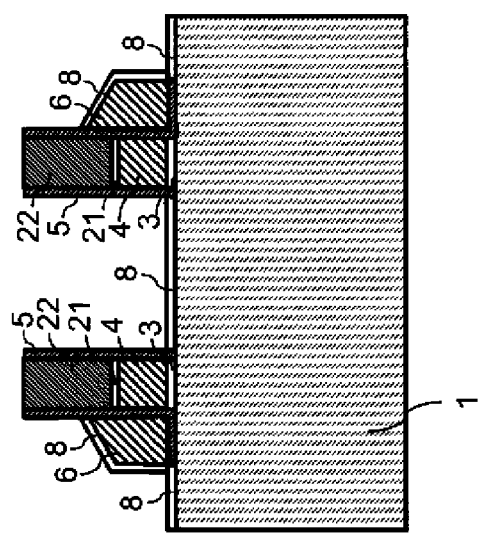
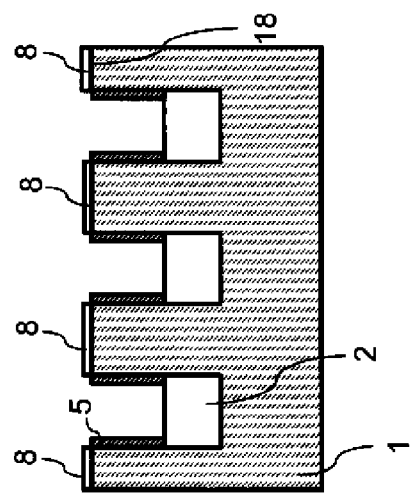

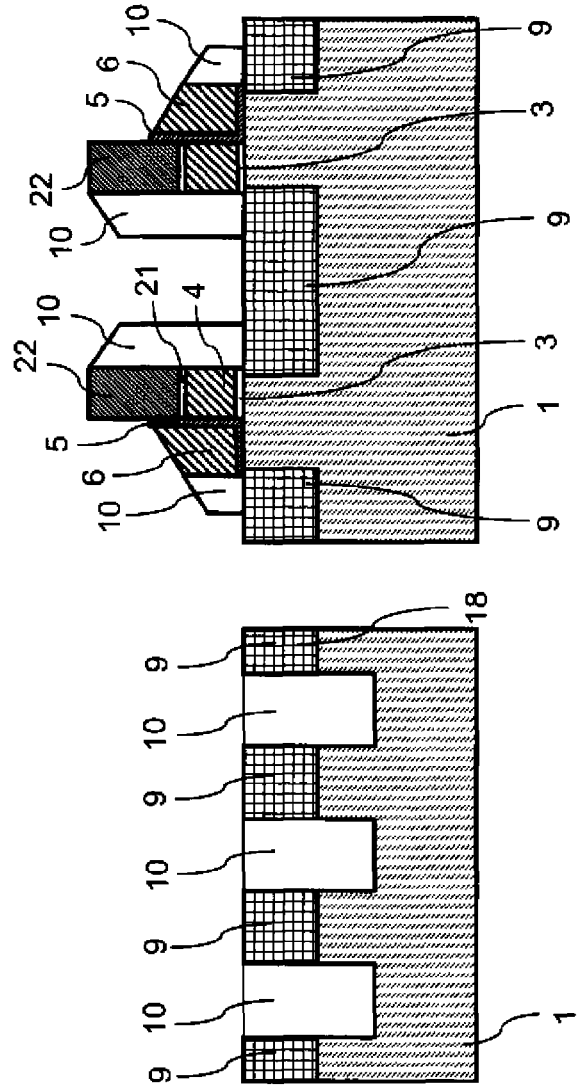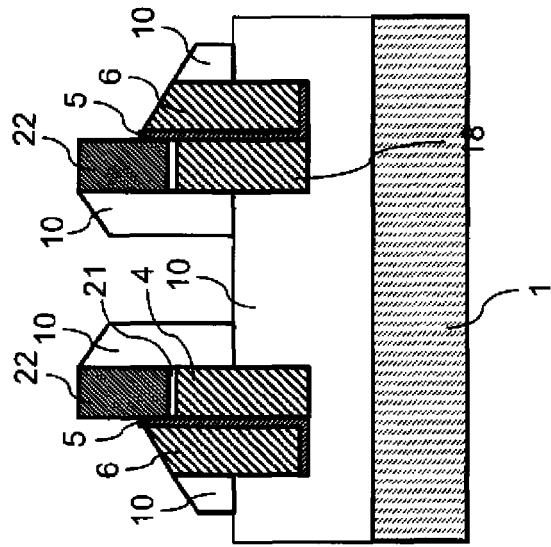

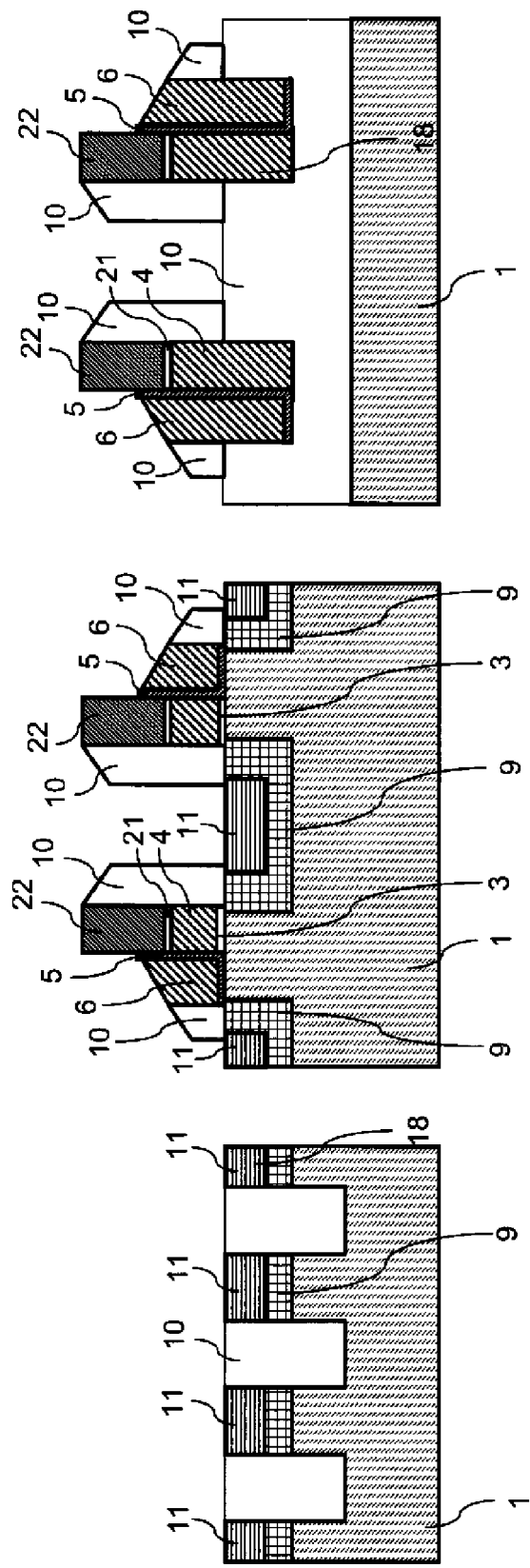

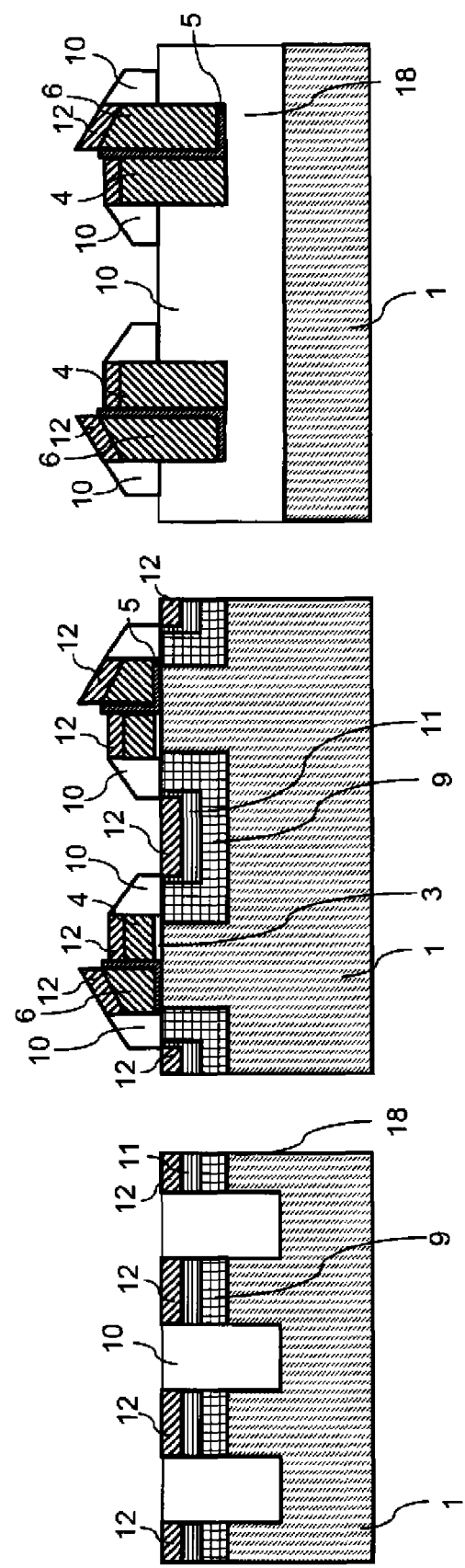

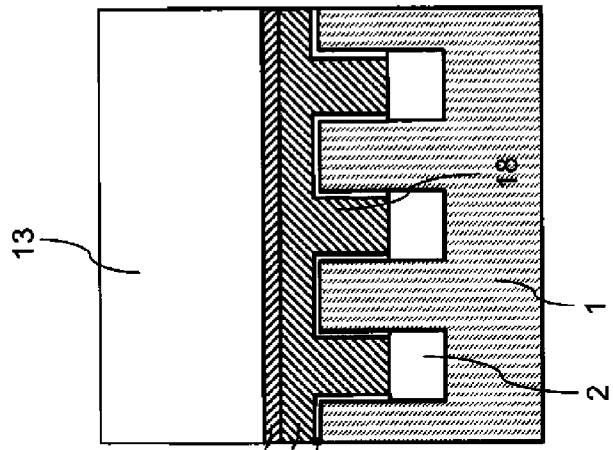
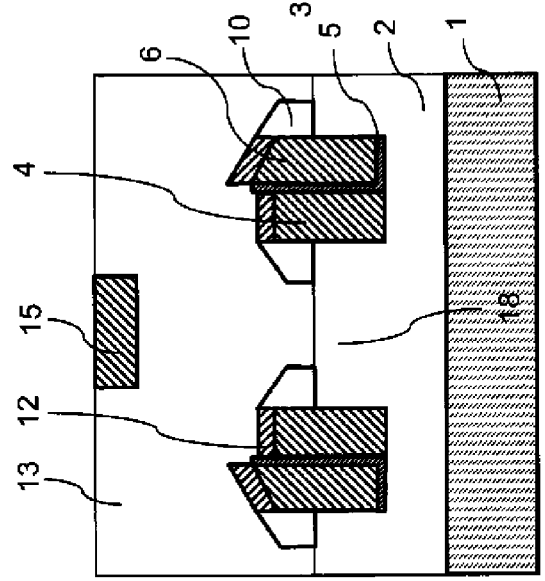
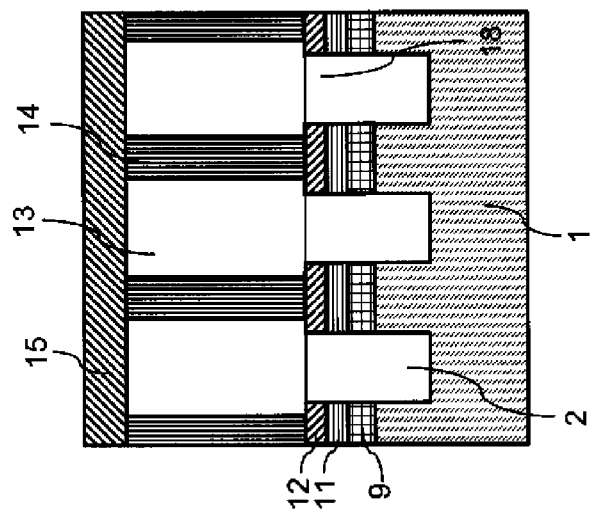

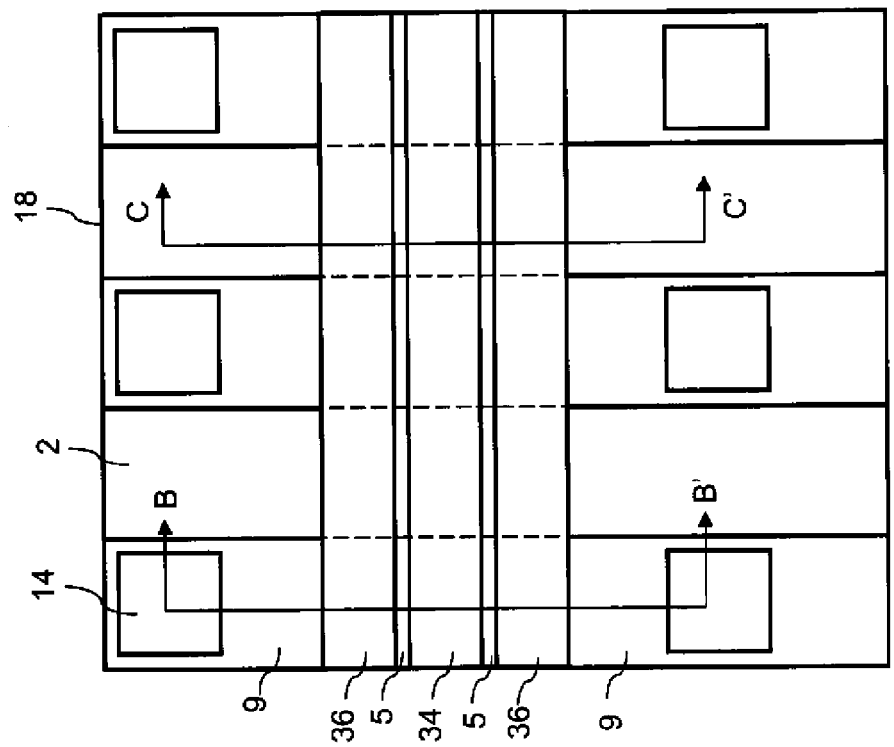
FIG. 51A
FIG. 51B
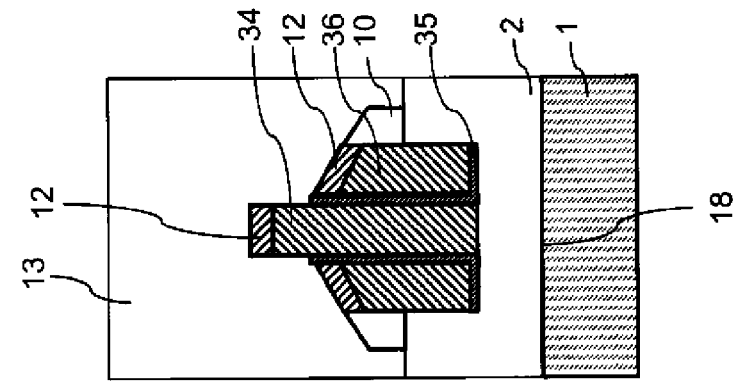
FIG. 51C
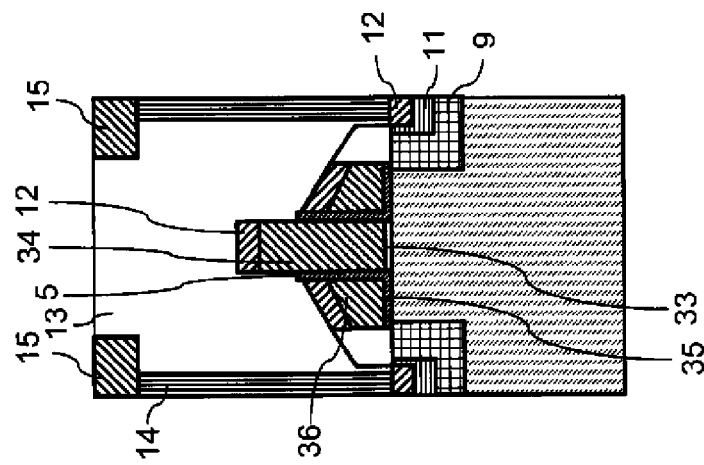

NONVOLATILE SEMICONDUCTOR MEMORY DEVICE AND METHOD FOR MANUFACTURING THE SAME

TECHNICAL FIELD

Reference to Related Application

This application is based upon and claims the benefit of the priority of Japanese patent application No. 2009-022952 filed on Feb. 3, 2009, the disclosure of which is incorporated herein in its entirety by reference thereto.

The present invention relates to a nonvolatile semiconductor memory device and a method for manufacturing the same. In particular, it relates to a split gate type nonvolatile semiconductor memory device having a fin-field effect transistor (FinFET) structure and a method for manufacturing the same.

BACKGROUND

Remarkable advances have been made in the increase of integration and speed of a nonvolatile semiconductor memory device such as a flash memory. Particularly, high-capacity flash memories are often used, instead of hard disks. Further, such nonvolatile semiconductor memory device is not only used by itself but also widely used as part of a system LSI by being embedded therein, such as a microcomputer with a built-in flash memory.

To achieve device miniaturization, Patent Document 1 discloses a split gate type nonvolatile semiconductor memory device having a FinFET structure. FIG. 52A is the same drawing shown in FIG. 25A of Patent Document 1, illustrating a cross section of a memory cell taken along a line parallel to a direction in which a current flows through the memory cell. FIGS. 52B and 52C are the same drawings shown in FIGS. 25B and 25C of Patent Document 1, respectively. FIGS. 52B and 52C illustrate cross sections of the memory cell taken along lines that are perpendicular to the above line and that go through a select gate 500 and a memory cell gate 550 of the memory cell, respectively. Further, FIGS. 52D and 52E are the same drawings shown in FIGS. 29 and 32 of Patent Document 1, respectively, illustrating plan views of other layout patterns. As shown in FIG. 52A, by forming the split gate type memory cell gate 550 adjacent to a side wall of the select gate 500 in a self-aligned manner, the select gate 500 and the memory gate 550 are formed close to each other in a small area. Further, as shown in FIGS. 52B and 52C, a channel region of a semiconductor substrate 100 is allowed to protrude into the select gate 500 and the memory gate 550, and not only the top surface but also the side walls of the protruded part of the semiconductor substrate 100 are used as a channel region to form a FinFET structure. In this way, an on-state current can be secured in a narrow width.

This memory cell is driven by applying positive voltages to the memory gate 550, the select gate 500, and a drain 310 and controlling the current flowing between the source 210 and the drain 310 based on the presence of electric charges in a charge storage layer 950. The protruded channel region shown in FIGS. 52B and 52C is formed by digging into a shallow trench isolation (STI) of the memory cell region and embedding the memory gate 550 and the select gate 500.

Further, as shown in the plan view of FIG. 52D, since the memory gate 550 is formed after the select gate 500 is formed, memory gate polysilicon may remain on side walls of a diffusion layer in the STI. Even in such case, by forming the STI in the form of an island and longitudinally installing the source 210 as a common source line, a memory gate polysilicon process residue 1555 formed on side walls of a diffusion layer in the STI does not form a short circuit of adjacent memory gates.

As shown in FIG. 52E, Patent Document 1 also discloses another example of the array in which the polysilicon process residue 1555 is actively used to short out adjacent memory gates in advance. In this case, shorted-out memory gates cannot be controlled individually.

Next, operations of the nonvolatile semiconductor memory device disclosed in Patent Document 1 will be described. For writing, positive voltages of (4.5 V and 5.5 V, for example) are applied to the source 210 and the memory gate 550, respectively. Further, a positive voltage lower than the voltage applied to the memory gate 550 is applied to the select gate 500, and the drain 310 is connected to ground. When these voltages are applied, some of the electrons flowing from the drain 310 to the source 210 are accelerated in the channel under the memory gate 550, and an ONO film under the memory gate 550 is implanted with some of the electrons, whereby writing is executed.

For erasing, a positive voltage (4.5 V, for example) is applied to the source 210, and a negative voltage (−3.0 V, for example) is applied to the memory gate 550. When these voltages are applied, electron-hole pairs are generated by interband tunneling in the source 210 under the memory gate 550, and some of the holes are accelerated by the electric field of the source 210. The ONO film is then implanted with the holes, whereby erasing is executed. The voltage applied to the select gate 500 for erasing may be 0 V or a negative voltage (0 V to approximately −3 V).

For reading, the source 210 is connected to ground, a positive voltage (2 V, for example) is applied to the memory gate 550 and the select gate 500, and a positive voltage (1 V, for example) is applied to the drain 310, to detect a current flowing between the drain 310 and the source 210. Information is read by using such characteristics that a smaller current flows when electrons are trapped in the ONO film (in a written state) and a larger current flows when holes are trapped or almost no electrical charges are trapped (in an erased state). During reading, electrons flow in a direction opposite to that during writing, and in this way, erroneous writing caused by disturbance is prevented.

Patent Document 1: Japanese Patent Kokai Publication No. JP-P2006-41354A

SUMMARY

The entire disclosure of Patent Document 1 is incorporated herein by reference thereto.

The following analyses are made based on the present invention. As proposed by Patent Document 1, in order to realize a high-speed and highly-integrated nonvolatile semiconductor memory device, a split gate type nonvolatile semiconductor memory device having a FinFET is effective. However, Patent Document 1 includes the following problems.

Namely, as shown in FIG. 52D, an element isolation is formed in the form of an island, and a memory-gate polysilicon residue is surrounded by the element isolation, to prevent adjacent memory gates from forming a short circuit. In this case, a sufficient distance needs to be assured between an element isolation end and a memory gate end above a diffusion layer to reduce variations of memory cell characteristics, and as a result, the cell size is increased.

In addition, even with such layout, since silicide layers are formed adjacent to a memory-gate polysilicon residue and an adjacent diffusion layer at the same time, a short circuit or a leak therebetween is more likely to occur. Particularly, since a maximum voltage between a memory gate and the diffusion layer (during erasing) is greater than that between a memory gate and a select gate (during writing), problematic degradation attributable to rewriting is caused. Particularly, the nonvolatile semiconductor memory device disclosed in Patent Document 1 is problematic when used for purposes that require high reliability, that is, when used as a vehicle-mounted microcomputer with a built-in flash memory, for example.

In addition, while adjacent memory gates can actively be shorted out (connected) and be used as shown in FIG. 52E, an unnecessary voltage is applied to a non-selected cell during writing, possibly resulting in erroneous writing. Further, because of the above memory gate polysilicon residue, degradation attributable to rewriting is still problematic.

Thus, a high-speed and highly-integrated nonvolatile semiconductor memory device which can be used for purposes that require high reliability, such as a vehicle-mounted microcomputer with a built-in flash memory, is demanded.

According to a first aspect of the present invention, there is provided a nonvolatile semiconductor memory device including: a semiconductor substrate having a plurality of trenches in parallel with each other on a surface of the semiconductor substrate; insulation layers each formed on a bottom surface of each of the plurality of trenches; a select gate electrode formed in a direction perpendicular to the plurality of trenches on the surface of the semiconductor substrate and side walls of the plurality of trenches via a first gate insulating film; a memory gate electrode formed on the surface of the semiconductor substrate and side walls of the plurality of trenches via a second gate insulating film formed of a multi-layer film including a charge storage layer, the memory gate electrode formed adjacent to the select gate electrode via an insulating film in a direction perpendicular to the plurality of trenches; and source/drain regions each formed on the surface of the semiconductor substrate between each pair of the plurality of trenches and sandwiching the select gate electrode and the memory gate electrode. A difference between a height of a surface of the select gate electrode and a height of a surface of the memory gate electrode is equal to or greater than a difference between a height of a surface of the insulation layers each formed on the bottom surface of each of the trenches and a height of a surface of the source drain regions.

Further, according to a second aspect of the present invention, there is provided a nonvolatile semiconductor memory device manufacturing method including: forming a plurality of trenches in parallel with each other on a surface of a semiconductor substrate; forming insulation layers each formed on a bottom surface of each of the plurality of trenches; and forming a first gate electrode extending in a direction perpendicular to the trenches on the surface of the semiconductor substrate and side walls of the trenches via a gate insulating film. The method further comprises: forming a first insulating film that covers the surface of the semiconductor substrate, the insulation layers in the trenches, and the surface of the first gate electrode; and forming a conductive layer that covers the first insulating film, carrying out an etch-back process to remove the conductive layer except the conductive layer formed on a side wall of the first gate electrode, and forming a second gate electrode adjacent to a side wall of the first gate electrode. The method further comprises: forming high concentration regions that serve as source/drain regions of a memory cell and sandwich the first and second gate electrodes on the surface of the semiconductor substrate and side walls of the trenches where the insulation layer is not formed. When the first gate electrode is formed, a surface of the first gate electrode is formed to have a sufficient height from a surface of the semiconductor substrate, such that when the second gate electrode is formed by the etch-back process, the conductive layer adjacent to side walls of the trenches can be removed completely by the etch-back process.

The meritorious effects of the present invention are summarized as follows.

According to the present invention, either in the first or second aspect, since a first gate electrode is formed to have a certain height, residue can be prevented from remaining on the side walls of the trenches on the semiconductor substrate surface. Thus, a high-speed and highly-integrated nonvolatile semiconductor memory device that can be used for purposes that require high reliability can be obtained.

BRIEF DESCRIPTIONS OF THE DRAWINGS

FIG. 1A illustrates a cross section of a nonvolatile semiconductor memory device according to a first example of the present invention, taken along line B-B' of FIG. 1B, and FIG. 1B is a plan view of the nonvolatile semiconductor memory device.

FIGS. 2A to 2C illustrate cross sections of the nonvolatile semiconductor memory device according to the first example of the present invention, taken along lines A-A', C-C', and D-D' of FIG. 1B, respectively.

FIG. 3 illustrates a relationship between a height of a surface of a semiconductor substrate and heights of surfaces of gate electrodes of the nonvolatile semiconductor memory device according to the first example of the present invention.

FIG. 4A illustrates a cross section of a nonvolatile semiconductor memory device according to a second example of the present invention, taken along line B-B' of FIG. 4B, and FIG. 4B is a plan view of the nonvolatile semiconductor memory device.

FIGS. 5A to 5C illustrate cross sections of the nonvolatile semiconductor memory device according to the second example of the present invention, taken along lines A-A', C-C', and D-D' of FIG. 4B, respectively.

FIGS. 8A to 8C illustrate cross sections of the nonvolatile semiconductor memory device according to the first example of the present invention in a manufacturing process continuous from FIG. 7A to 7C based on the manufacturing method according to the third example, taken along the lines A-A', B-B', and C-C'.

FIGS. 9A to 9C illustrate cross sections of the nonvolatile semiconductor memory device according to the first example of the present invention in a manufacturing process continuous from FIG. 8A to 8C based on the manufacturing method according to the third example, taken along the lines A-A', B-B', and C-C'.

FIGS. 11A to 11C illustrate cross sections of the nonvolatile semiconductor memory device according to the first example of the present invention in a manufacturing process continuous from FIGS. 10A to 10C based on the manufacturing method according to the third example, taken along the lines A-A', B-B', and C-C'.

FIGS. 12A to 12C illustrate cross sections of the nonvolatile semiconductor memory device according to the first example of the present invention in a manufacturing process continuous from FIGS. 11A to 11C based on the manufacturing method according to the third example, taken along the lines A-A', B-B', and C-C'.

FIGS. 13A to 13C illustrate cross sections of the nonvolatile semiconductor memory device according to the first example of the present invention in a manufacturing process continuous from FIGS. 12A to 12C based on the manufacturing method according to the third example, taken along the lines A-A', B-B', and C-C'.

FIGS. 17A to 17C illustrate cross sections of the nonvolatile semiconductor memory device according to the first example of the present invention in a manufacturing process continuous from FIGS. 16A to 16C based on the manufacturing method according to the third example, taken along the lines A-A', B-B', and C-C'.

FIGS. 18A to 18C illustrate cross sections of the nonvolatile semiconductor memory device according to the first example of the present invention in a manufacturing process continuous from FIGS. 17A to 17C based on the manufacturing method according to the third example, taken along the lines A-A', B-B', and C-C'.

FIGS. 20A to 20C illustrate cross sections of the nonvolatile semiconductor memory device according to the first example of the present invention in a manufacturing process continuous from FIGS. 19A to 19C based on the manufacturing method according to the third example, taken along the lines A-A', B-B', and C-C'.

FIGS. 25A to 25C illustrate cross sections of a nonvolatile semiconductor memory device according to the second example of the present invention in a manufacturing process based on a manufacturing method, termed as a fourth example, taken along the lines A-A', B-B', and C-C' of FIG. 4B, respectively.

FIGS. 27A to 27C illustrate cross sections of the nonvolatile semiconductor memory device according to the second example of the present invention in a manufacturing process continuous from FIGS. 26A to 26C based on the manufacturing method according to the fourth example, taken along the lines A-A', B-B', and C-C'.

FIGS. 29A to 29C illustrate cross sections of the nonvolatile semiconductor memory device according to the second example of the present invention in a manufacturing process continuous from FIGS. 28A to 28C based on the manufacturing method according to the fourth example, taken along the lines A-A', B-B', and C-C'.

FIGS. 30A to 30C illustrate cross sections of the nonvolatile semiconductor memory device according to the second example of the present invention in a manufacturing process continuous from FIGS. 29A to 29C based on the manufacturing method according to the fourth example, taken along the lines A-A', B-B', and C-C'.

FIGS. 32A to 32C illustrate cross sections of the nonvolatile semiconductor memory device according to the second example of the present invention in a manufacturing process continuous from FIGS. 31A to 31C based on the manufacturing method according to the fourth example, taken along the lines A-A', B-B', and C-C'.

FIGS. 36A to 36C illustrate cross sections of the nonvolatile semiconductor memory device according to the second example of the present invention in a manufacturing process continuous from FIGS. 35A to 35C based on the manufacturing method according to the fourth example, taken along the lines A-A', B-B', and C-C'.

FIGS. 37A to 37C illustrate cross sections of the nonvolatile semiconductor memory device according to the second example of the present invention in a manufacturing process continuous from FIGS. 36A to 36C based on the manufacturing method according to the fourth example, taken along the lines A-A', B-B', and C-C'.

FIGS. 46A to 46C illustrate cross sections of the nonvolatile semiconductor memory device according to the fifth example of the present invention in a manufacturing process continuous from FIGS. 43A to 43C based on the manufacturing method according to the sixth example, taken along the lines A-A', B-B', and C-C'.

FIGS. 49A to 49C illustrate cross sections of the nonvolatile semiconductor memory device manufactured by the manufacturing method according to the sixth example of the present invention, taken along lines A-A', C-C', and D-D' of FIG. 48A, respectively.

FIGS. 51A and 51B illustrate cross sections of a semiconductor memory device manufactured by a manufacturing method according to a seventh example of the present invention, taken along lines B-B', C-C' of FIG. 51C, respectively, and FIG. 51C is a plan view of the semiconductor memory.

PREFERRED MODES

Figure 6:
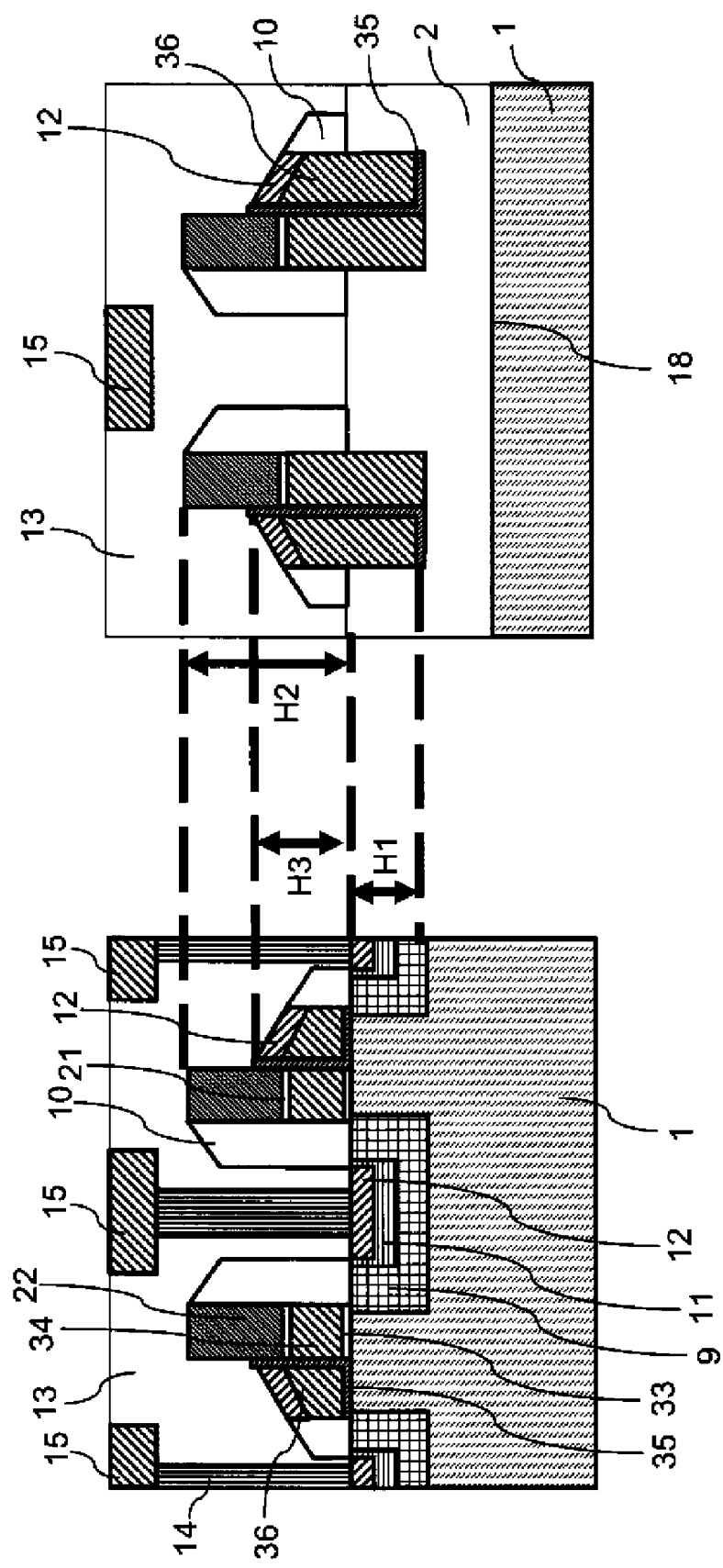
FIG. 6 illustrates a relationship between a height of a surface of a semiconductor substrate and heights of surfaces of gate electrodes of the nonvolatile semiconductor memory device according to the second example of the present invention.

Exemplary embodiments of the present invention will be hereinafter described with reference to the drawings as needed. The drawings and reference characters referred to in the description of the exemplary embodiments are used to illustrate examples of the exemplary embodiments. Therefore, variations of the exemplary embodiments according to the present invention are not limited by the drawings and reference characters.

For example, as shown in FIGS. 1, 4, and 51, a nonvolatile semiconductor memory device according to an exemplary embodiment of the present invention includes: a semiconductor substrate 1 having a plurality of trenches 18 in parallel with each other on a surface of the semiconductor substrate 1 (see FIGS. 1B, 4B, and 51C); insulation layers 2 each formed on a bottom surface of each of the plurality of trenches 18; a select gate electrode 34 formed in a direction perpendicular to the plurality of trenches 18 on the surface of the semiconductor substrate 1 and side walls of the plurality of trenches 18 via a first gate insulating film 33; a memory gate electrode 36 formed on the surface of the semiconductor substrate 1 and side walls of the plurality of trenches 18 via a second gate insulating film 35 formed of a multilayer film including a charge storage layer, the memory gate electrode 36 formed adjacent to the select gate electrode 34 via an insulating film in a direction perpendicular to the plurality of trenches 18; and source/drain regions 11 each formed on the surface of the semiconductor substrate 1 between each pair of the plurality of trenches 18 and sandwiching the select gate electrode and the memory gate electrode. A difference between a height of a surface of the select gate electrode and a height of a surface of the memory gate electrode (difference between H2 and H3 in FIGS. 3 and 6) is equal to or greater than a difference (H1) between a height of a surface of the insulation layers each formed on the bottom surface of each of the trenches and a height of a surface of the source drain regions 11. Based on the above configuration, since the difference between the height of the surface of the select gate electrode and the height of the surface of the memory gate electrode (difference between H2 and H3 in FIGS. 3 and 6) is equal to or greater than the difference (H1) between the height of the surface of the insulation layers and the height of the surface of the source drain regions 11, when a second gate electrode is formed by an etch-back process adjacent to a side wall of a first gate electrode, polysilicon in the trenches 18 can be removed without leaving any residue thereof. Further, since the height of the surface of the select gate electrode is sufficiently different from the height of the surface of the memory gate electrode, even after the silicide layer is formed on top of the select gate electrode and the memory gate electrode, there is little chance that these gate electrodes short out.

Further, for example, as shown in FIGS. 1A, 4A, and 51A, based on a nonvolatile semiconductor memory device according to an exemplary embodiment of the present invention, the height of the surface of the select gate electrode 34 is greater than the height of the surface of the memory gate electrode 36, and the memory gate electrode 36 is formed adjacent to a side wall of the select gate electrode 34.

Figure 50C:
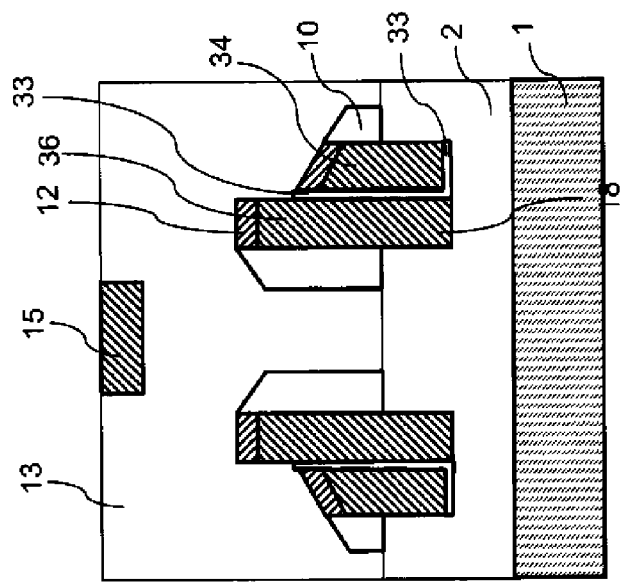
FIGS. 50A to 50C illustrate cross sections of a semiconductor memory device manufactured by a manufacturing method according to a sixth example of the present invention, taken along A-A' B-B', and D-D', respectively.
Figure 50B:
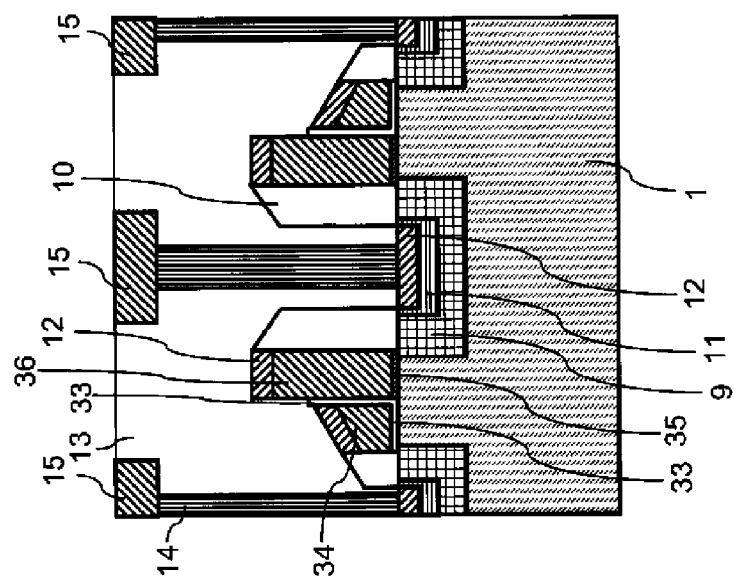
Figure 50A:
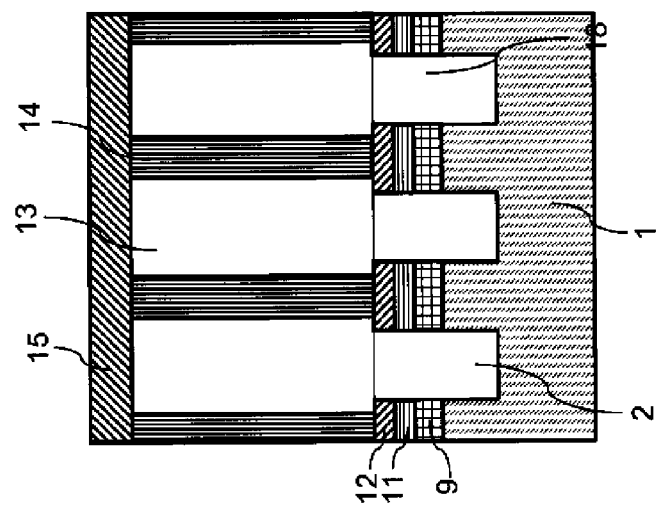
Figure 52A:
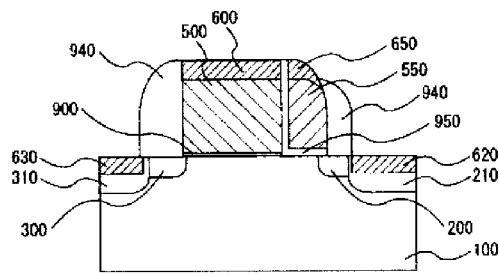
FIGS. 52A to 52E illustrate cross sections and plan views of a conventional nonvolatile semiconductor memory device disclosed in Patent Document 1.
Figure 52B:
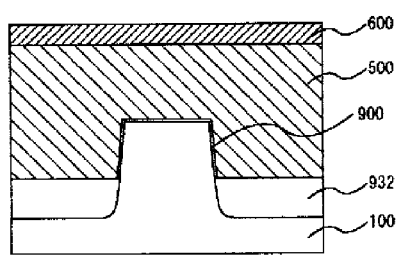
Figure 52C:
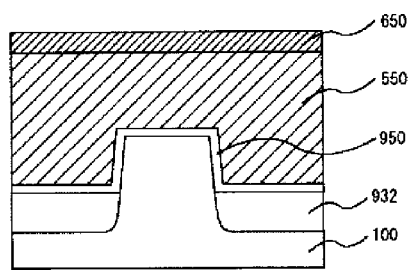
Figure 52D:
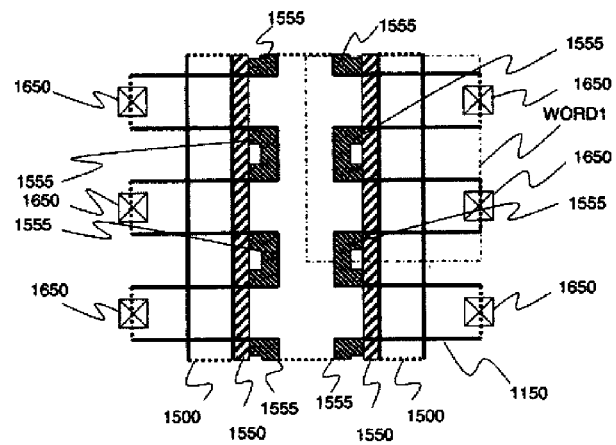
Figure 52E:
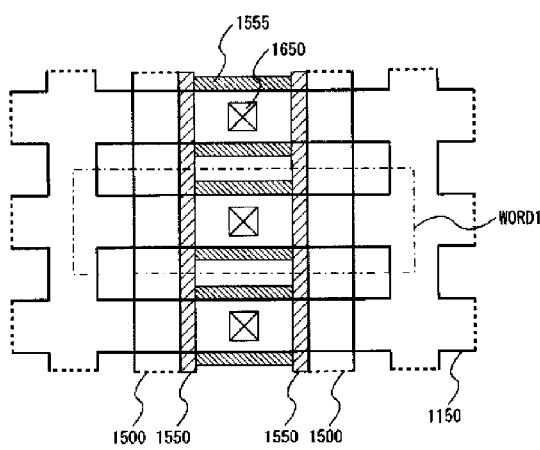

Further, for example, as shown in FIG. 50, based on a nonvolatile semiconductor memory device according to an exemplary embodiment of the present invention, the height of the surface of the memory gate electrode 36 is greater than the height of the surface of the select gate electrode 34, and the select gate electrode 34 is formed adjacent to a side wall of the memory cell gate electrode 36.

Further, for example, as shown in FIG. 4, based on a nonvolatile semiconductor memory device according to an exemplary embodiment of the present invention, dummy layers 21 and 22 are formed on top of the select gate electrode 34. The height of the surface of the select gate electrode 34 includes the heights of the dummy layers 21 and 22, and the memory gate electrode 36 is formed adjacent to a side wall of the select gate electrode 34 of which height includes the heights of the dummy layers 21 and 22. Namely, the memory gate electrode 36 is formed adjacent to a side wall of the select gate electrode 34, when the memory gate 36 has a low height. The dummy layers 21 and 22 on top of the select gate electrode 34 structurally serve as memory gate electrodes, when the memory gate electrode 36 is formed on side walls of the dummy layers. Thus, when forming the memory gate electrode 36, no residue remains on side walls of the trenches (STI) in the semiconductor substrate 1.

Further, for example, as shown in FIG. 51, based on a nonvolatile semiconductor memory device according to an exemplary embodiment of the present invention, the memory gate electrode 36 includes first and second memory gate electrodes sandwiching the select gate electrode 34 via an insulating film 5, and each pair of the source/drain regions 11 sandwiches the first memory gate electrode, the select memory gate electrode, and the second memory gate electrode and are formed adjacent to a side of the first memory gate electrode or the second memory gate electrode, the side being opposite to the select memory gate electrode.

Further, as shown in FIG. 51, based on a nonvolatile semiconductor memory device according to an exemplary embodiment of the present invention, assuming that the memory gate electrode is a first memory gate electrode, a second memory gate electrode is formed adjacent to the first memory gate electrode via the select gate electrode, and the second memory gate electrode is formed on the surface of the semiconductor substrate and side walls of the plurality of trenches 18 via the second gate insulating film. The memory gate electrode is formed adjacent to the select gate electrode via an insulating film in a direction perpendicular to the plurality of trenches 18. Each pair of the source/drain regions 11 sandwiches the first memory gate electrode, the select gate electrode, and the second memory gate electrode arranged in this order.

Further, based on a nonvolatile semiconductor memory device according to an exemplary embodiment of the present invention, dummy layers 21 and 22 are formed on top of the memory gate electrode 36. The height of the surface of the memory gate electrode 36 includes heights of the dummy layers, and the select gate electrode 34 is formed adjacent to a side wall of the memory gate electrode 36 of which height includes heights of the dummy layers. Namely, according to the present invention, the select gate may be formed first, and a memory gate is next formed adjacent to a side wall of the select gate. Alternatively, a memory gate may be formed first, and a select gate is next formed adjacent to a side wall of the memory gate. Either way, the gate electrode formed first may have a greater apparent height by forming a dummy layer on top of the gate electrode formed first.

Further, as shown in FIG. 4, based on a nonvolatile semiconductor memory device according to an exemplary embodiment of the present invention, the dummy layer 22 may be formed of a silicon nitride film.

Further, as shown in FIGS. 1 and 4, based on a nonvolatile semiconductor memory device according to an exemplary embodiment of the present invention, metal wirings 15 are formed above the memory gate electrode 36 and the select gate electrode 34 via an interlayer insulating film 13 that covers the surface of the semiconductor substrate, and the source/drain regions 11 are connected to the metal wirings 15 via contacts 14 formed in the interlayer insulating film 13.

Figure 7C:
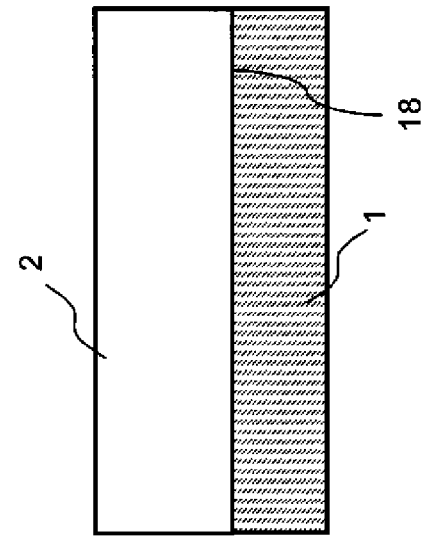
FIGS. 7A to 7C illustrate cross sections of a nonvolatile semiconductor memory device according to the first example of the present invention in a manufacturing process based on a manufacturing method, termed as a third example, taken along the lines A-A', B-B', and C-C' of FIG. 1B, respectively.
Figure 7B:
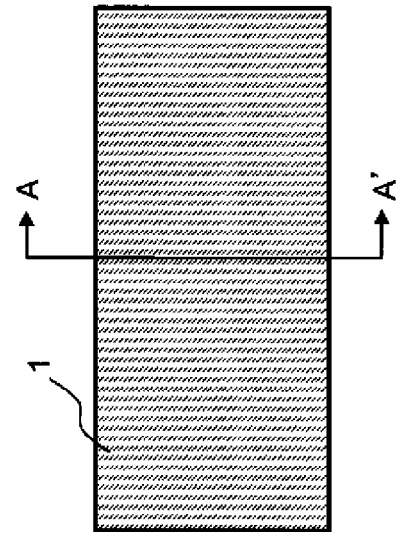
Figure 7A:
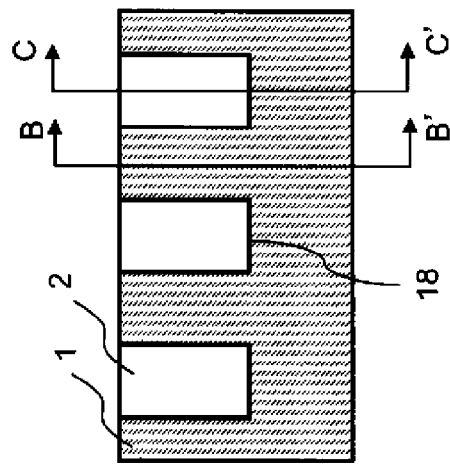
Figure 21C:
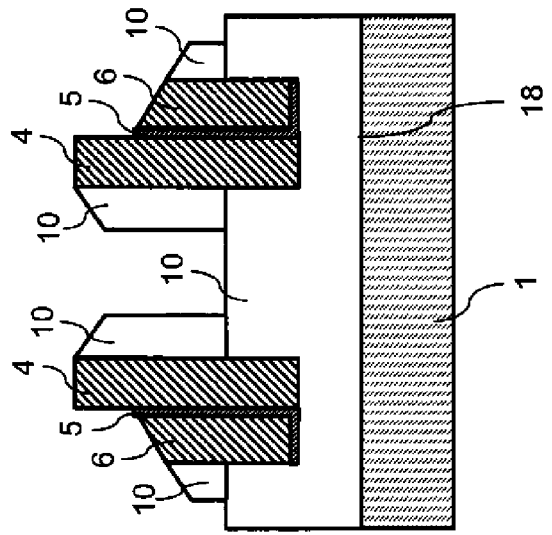
FIGS. 21A to 21C illustrate cross sections of the nonvolatile semiconductor memory device according to the first example of the present invention in a manufacturing process continuous from FIGS. 20A to 20C based on the manufacturing method according to the third example, taken along the lines A-A', B-B', and C-C'.
Figure 21B:
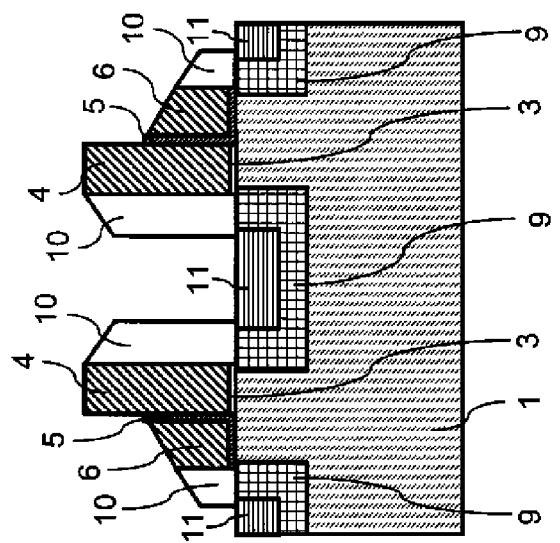
Figure 21A:
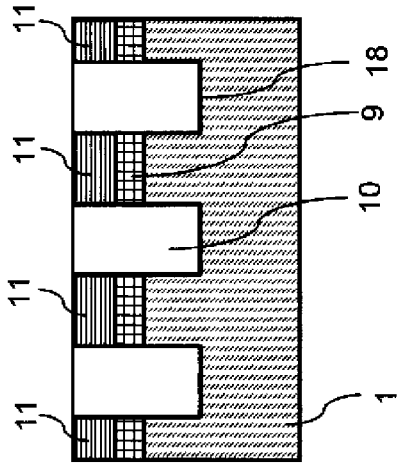
Figure 45C:
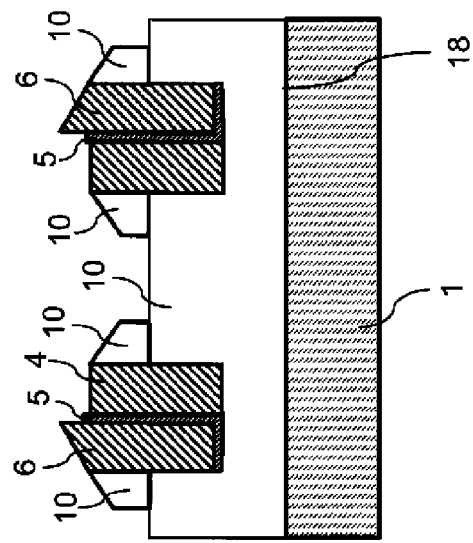
FIGS. 45A to 45C illustrate cross sections of the nonvolatile semiconductor memory device according to the fifth example of the present invention in a manufacturing process continuous from FIGS. 42A to 42C based on the manufacturing method according to the sixth example, taken along the lines A-A', B-B', and C-C'.
Figure 45B:
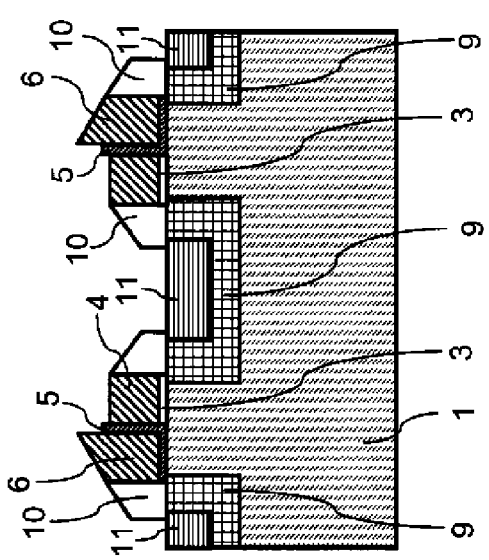
Figure 45A:
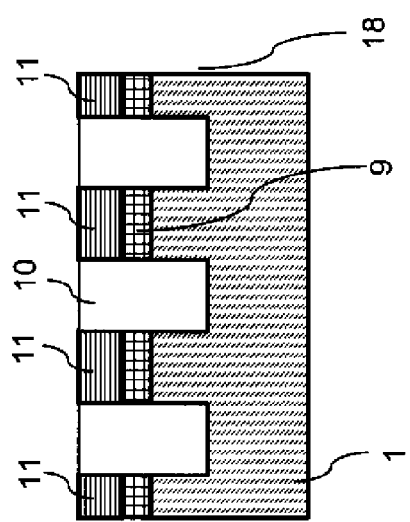
Figure 47C:
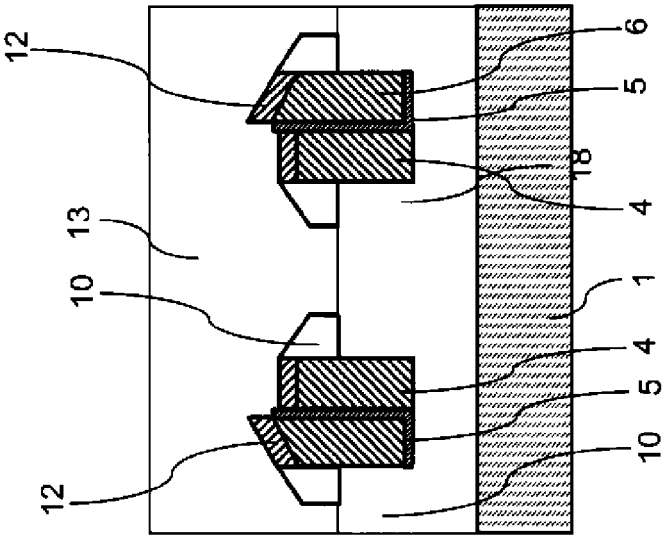
FIGS. 47A to 47C illustrate cross sections of the nonvolatile semiconductor memory device according to the fifth example of the present invention in a manufacturing process continuous from FIGS. 44A to 44C based on the manufacturing method according to the sixth example, taken along the lines A-A', B-B', and C-C'.
Figure 47B:
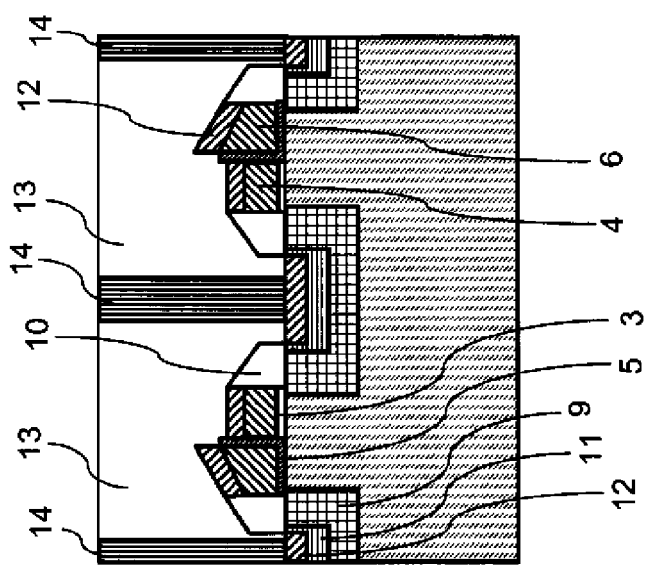
Figure 47A:
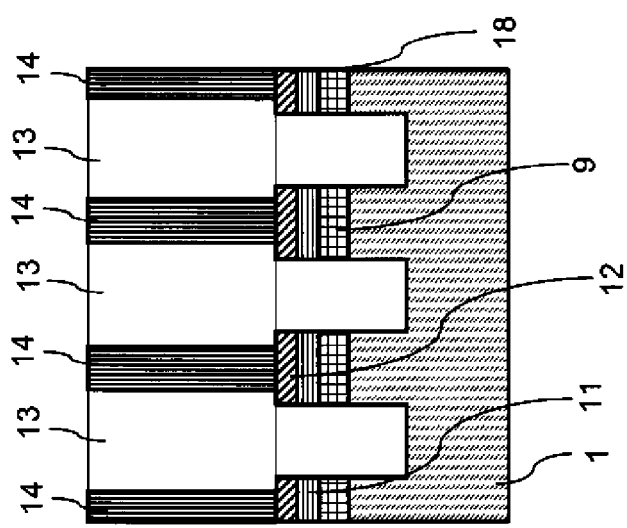

Further, as shown in FIGS. 7 to 49, a nonvolatile semiconductor memory device manufacturing method according to an exemplary embodiment of the present invention includes: forming a plurality of trenches 18 in parallel with each other on a surface of a semiconductor substrate (before the trenches 18 are filled with the silicon dioxide film 2 in FIG. 7); forming insulation layers each formed on a bottom surface of each of the plurality of trenches 18 (FIG. 8); forming a first gate electrode 4 extending in a direction perpendicular to the trenches 18 on the surface of the semiconductor substrate and side walls of the trenches 18 via a gate insulating film 3 (FIGS. 10 and 26); forming a first insulating film 5 that covers the surface of the semiconductor substrate 1, the insulation layers in the trenches 18, and the surface of the first gate electrode 4 (FIGS. 11 and 27); forming a conductive layer 6 that covers the first insulating film 5, carrying out an etch-back process to remove the conductive layer 6 except the conductive layer 6 formed on a side wall of the first gate electrode 4, and forming a second gate electrode 6 adjacent to a side wall of the first gate electrode 4 (FIGS. 13 and 29); and forming high concentration regions that serve as source/drain regions of a memory cell and sandwich the first and second gate electrodes 4 and 6 on the surface of the semiconductor substrate and side walls of the trenches where the insulation layer 2 is not formed (FIGS. 21, 37, and 45). When the first gate electrode 4 is formed (FIGS. 10 and 26), a surface of the first gate electrode 4 is formed to have a sufficient height from a surface of the semiconductor substrate (H2 in FIGS. 24 and 40), such that when the second gate electrode 6 is formed by the etch-back process (FIGS. 13 and 29), the conductive layer 6 adjacent to side walls of the trenches 18 can be removed completely by the etch-back process. Namely, since the first gate electrode is formed prior to the memory gate electrode and has a height sufficiently higher than that of the memory gate electrode, although an etch-back process to form the second gate electrode is carried out until the conductive layer 6 formed adjacent to side walls of the trenches (STI) is completely removed, the second gate electrode having a necessary height can be formed.

Figure 24:
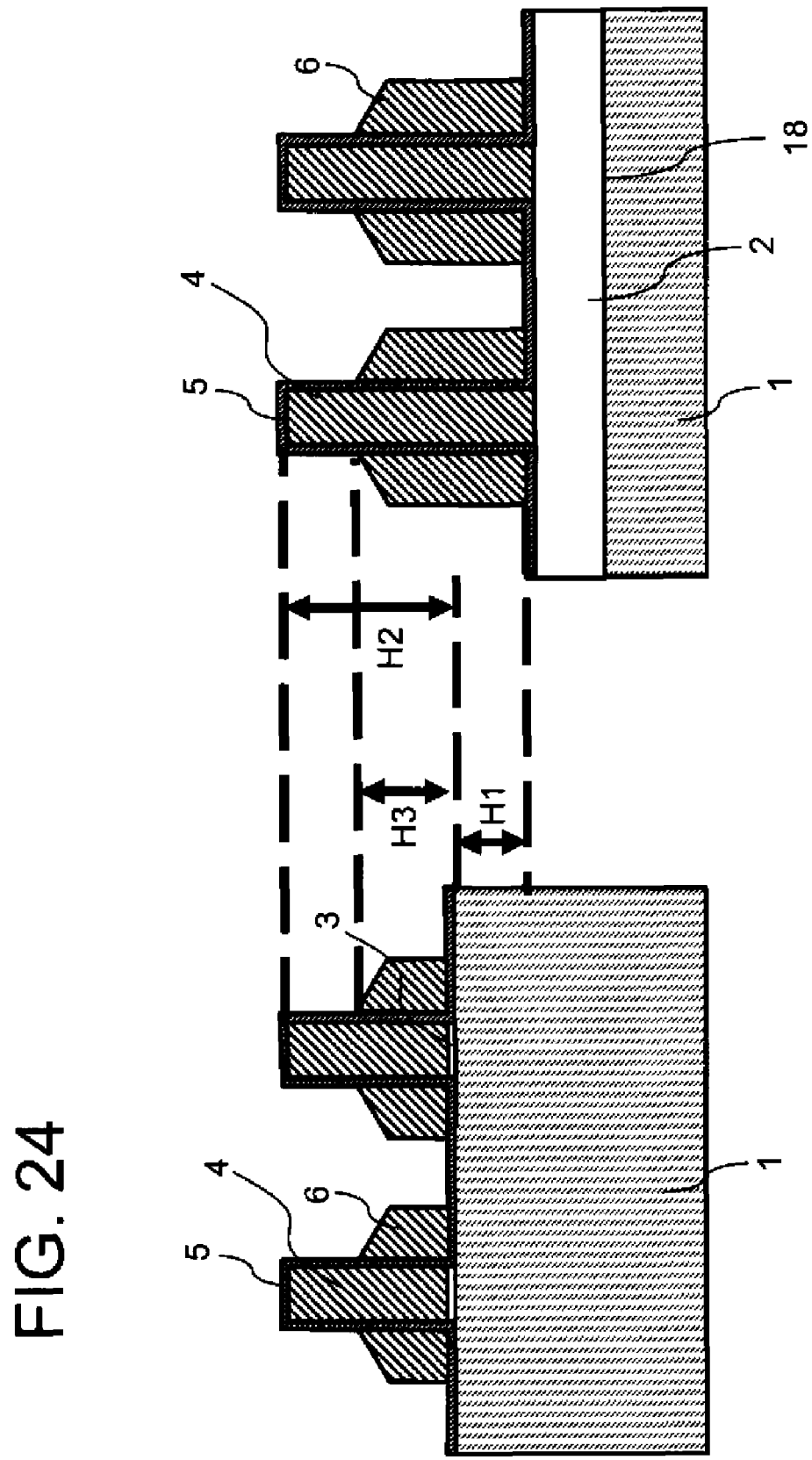
FIG. 24 illustrates a relationship between a height of a surface of a semiconductor substrate and heights of surfaces of gate electrodes of the nonvolatile semiconductor memory device according to the first example of the present invention manufactured by the manufacturing method according to the third example.
Figure 40:
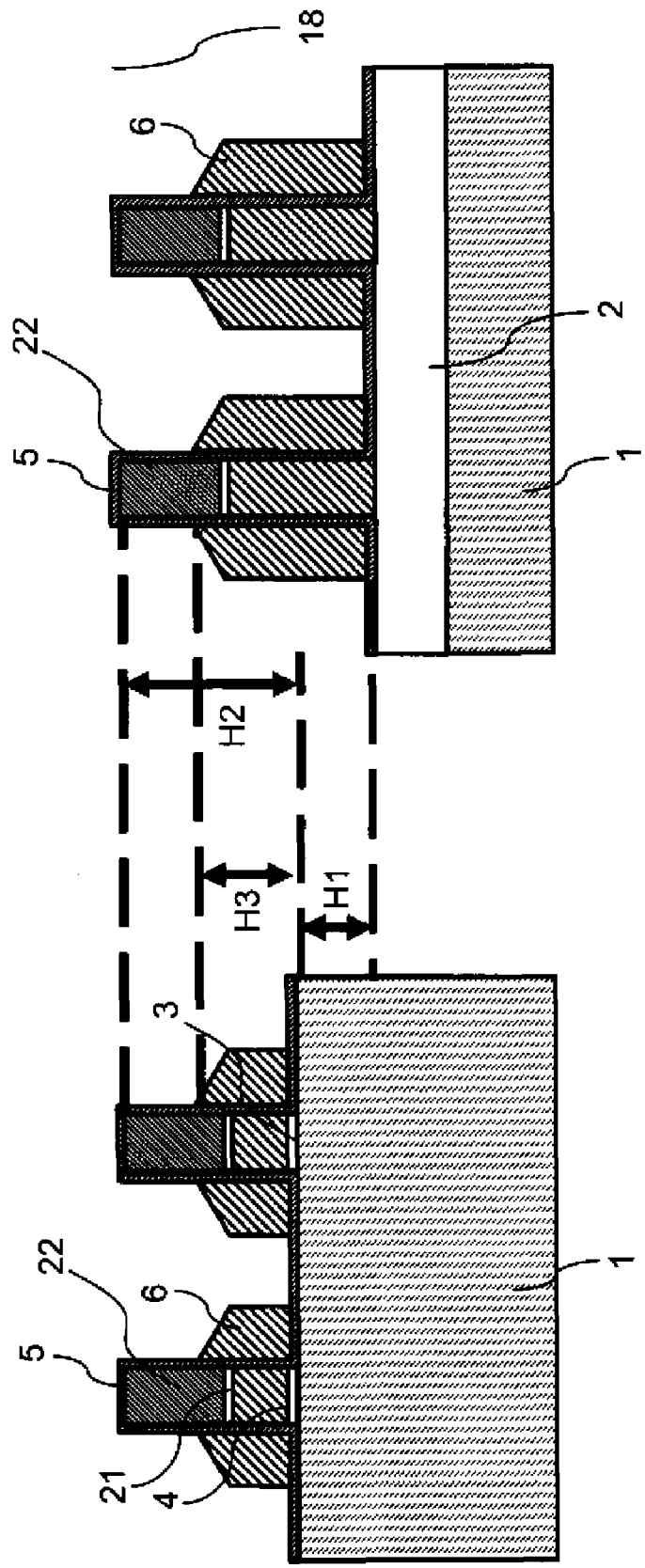
FIG. 40 illustrates a relationship between a height of a surface of a semiconductor substrate and heights of surfaces of gate electrodes of the nonvolatile semiconductor memory device according to the second example of the present invention manufactured by the manufacturing method according to the fourth example.

Further, for example, as shown in FIGS. 24 and 40, based on a nonvolatile semiconductor memory device manufacturing method according to an exemplary embodiment of the present invention, the first gate electrode is formed (FIGS. 10 and 26) to satisfy a formula H2≧H1+H3, assuming that a height from a surface of the insulation layers 2 each formed on a bottom surface of each of the plurality of trenches 18 (FIG. 8) to a surface of the semiconductor substrate to be H1; a height from a surface of the first gate electrode to the surface of the semiconductor substrate to be H2; and a height from a surface of the second gate electrode to the surface of the semiconductor substrate to be H3. By forming the first gate electrode to satisfy the above formula, when the second gate electrode is formed by an etch-back process, no residue of the conductive layer 6 remains adjacent to side walls of the trenches 18.

Further, as shown in FIGS. 7 to FIG. 49, based on a nonvolatile semiconductor memory device manufacturing method according to an exemplary embodiment of the present invention, the first gate electrode 4 is the select gate electrode 34 of the memory cell, and the second gate electrode 6 is the memory gate electrode 36 of the memory cell. Further, forming the first insulating film 5 is forming a multilayer film including a charge storage layer.

Further, for example, as shown in FIG. 50, based on a nonvolatile semiconductor memory device manufacturing method according to an exemplary embodiment of the present invention, the first gate electrode 4 is the memory gate electrode 36 of the memory cell, and the second gate electrode 6 is the select gate electrode 34 of the memory cell. The nonvolatile semiconductor memory device manufacturing method further includes forming the gate insulating film 3 as a multilayer film including a charge storage layer before forming the first gate electrode 4. Namely, either the select gate electrode or the memory gate electrode may be formed first. When the memory gate electrode is formed first, the gate insulating film 3 under the first gate electrode 4 may be formed as a multilayer film including a charge storage layer Further, for example, as shown in FIGS. 25 to 49, based on a nonvolatile semiconductor memory device manufacturing method according to an exemplary embodiment of the present invention, forming the first gate electrode (FIGS. 25 and 26) includes forming dummy layers 21 and 22 on top of the conductive layer 4 that servers as the gate electrode, and the first gate electrode is formed, such that a height of a surface of the first gate electrode from the surface of the semiconductor substrate includes heights of the dummy layers. Namely, as shown in FIG. 40, since the second gate electrode is formed adjacent to side walls of the first gate electrode and the dummy layers, as long as the first gate electrode has a sufficient structural height when the second gate electrode is formed, the first gate electrode may have a dummy layer that does not electrically serve as electrodes on top thereof. If the dummy layer is an insulation layer, for example, the first gate electrode 4 and the metal wiring 15 in an upper layer do not form a short circuit. Thus, the contact 14 between the semiconductor substrate 1 and the metal wiring 15 in an upper layer can be further shortened.

Further, for example, as shown in FIGS. 41 to 49, a nonvolatile semiconductor memory device manufacturing method according to an exemplary embodiment of the present invention may further include removing dummy layers 21 and 22 after forming the second gate electrode 6. By removing the dummy layers, the contact 14 between the metal wiring 15 in an upper layer and the semiconductor substrate 1 can be shortened.

Further, for example, as shown in FIGS. 1 and 2, a nonvolatile semiconductor memory device manufacturing method according to an exemplary embodiment of the present invention, wherein forming insulation layers 2 each formed on a bottom surface of each of the plurality of trenches 18 further includes: forming an element isolation region (STI) by completely filling the trenches 18 with the insulation layer 2 (FIG. 1); removing the insulation layer 2 in the upper portion of each of the trenches 18 while leaving the insulation layer 2 on the bottom of each of the trenches 18; exposing side walls of the semiconductor substrate 1 in the upper portion of each of the trenches 18. Since channels can also be formed in the exposed side walls of the semiconductor substrate by a subsequent process, a highly-integrated and high-speed nonvolatile semiconductor memory device can be obtained. Based on examples, the present invention will be hereinafter described in detail with reference to the drawings.

FIRST EXAMPLE

FIG. 1A is a cross section of a memory cell portion of a nonvolatile semiconductor memory device according to a first example. Lightly doped drains (LDD) 9, diffusion layers 11 that serve as source/drain regions, and silicide layers 12 are formed in the surface of a semiconductor substrate 1. Between each pair of the diffusion layers 11 that serve as source/drain regions, a memory cell is arranged. A first gate insulating film (select gate insulating film) 33 is formed on the surface of the semiconductor substrate 1, and a select gate electrode 34 is formed on the first gate insulating film 33. Further, a second gate insulating film (memory gate insulating film) 35 is formed on the surface of the semiconductor substrate 1, and a memory gate electrode 36 is formed on the second gate insulating film 35. The memory gate insulating film 35 is composed of an ONO film 5, which is formed by layers of a silicon oxide film, a silicon nitride film, and a silicon oxide film. The silicon nitride included in the ONO film 5 serves as a charge storage layer in the nonvolatile semiconductor memory cell. This ONO film 5 also serves as an insulator between the memory gate electrode 36 and the select gate electrode 34. The silicide layer 12 is also formed on top of the memory gate electrode 36 and the select gate electrode 34 to reduce gate electrode wiring resistance. Furthermore, the diffusion layer 11 is provided with a contact 14 and connected to a metal wiring 15 located in an upper layer. The memory cell operation itself is approximately identical to that disclosed in the above Patent Document 1.

FIG. 1B is a plan view of the nonvolatile semiconductor memory device according to the first example. In FIG. 1B, for clarity, metal wiring layers and interlayer insulating films are not illustrated. A plurality of trenches 18 are formed in parallel with each other on the surface of the semiconductor substrate. On the bottom surface of each of the trenches 18, a silicon dioxide film 2 is formed. In FIG. 1B, the bottom and side surfaces of the silicon dioxide films 2 vertically provided in parallel with each other form the trenches 18. Further, pairs of the memory gate electrode 36 and the select gate electrode 34 are formed in parallel with each other in a direction perpendicular to the trenches 18, and each pair of the gate electrodes sandwiches the ONO film 5. The silicon dioxide films 2 are not formed in areas between two of the select gate electrodes 34 and between two of the memory gate electrodes 36. In each of the areas, the LDD9, the diffusion layer 11 that serves as source/drain regions of the memory cell, and the silicide layer 12 are formed. In FIG. 1B, the diffusion layers 11 and the silicide layers 12 are not illustrated. Each of the source/drain regions is provided with the contact 14 and is connected to the metal wiring 15 (not illustrated) in an upper layer. FIG. 1A is a cross section of the nonvolatile semiconductor memory device taken along line B-B' in FIG. 1B.

FIGS. 2A to 2C are cross sections of the nonvolatile semiconductor memory device taken along lines A-A', C-C', and D-D' of FIG. 1B, respectively. In FIG. 2C, the semiconductor substrate 1 has portions which protrude into a polysilicon 4 that serves the select gate electrode 34 with a silicon dioxide film 3 in between. The surface and side walls of each of the portions are a select gate channel region. Since the channels are formed on the surface (including the side walls) of each of the protruding portions of the semiconductor substrate 1, a large channel width can be obtained in a small area. As seen from FIG. 2C, the deeper the trenches 18 are, the greater the channel width will be. Thus, it is desirable that the trenches 18 have a sufficient depth.

FIG. 3 illustrates a characteristic feature of the present invention, that is, a relationship between a height of a surface of the select gate electrode 34, a height of a surface of the memory gate electrode 36, and a depth of the trenches 18. Right-hand and left-hand drawings of FIG. 3 are cross sections of the nonvolatile semiconductor memory device, taken along the lines B-B' and C-C' of FIG. 1B, respectively. These cross sections are the same as those shown in FIGS. 1A and 2B, and the heights are aligned for comparison.

In FIG. 3, a reference character H1 denotes a depth from a surface of the semiconductor substrate 1 having the diffusion layer 11 in which a source/drain region is formed to a surface of the insulation layer formed on the bottom surface of each of the trenches 18. As can be seen from FIG. 2C, the depth of the trenches 18 is identical to the height of the portions of the semiconductor substrate 1 protruding into the polysilicon 4 that serves as the select gate electrode 34.

Further, in FIG. 3, a reference character H2 denotes a height from the surface of the semiconductor substrate 1 to a surface of the select gate electrode 34. While the silicide layer 12 is formed on top of the select gate electrode 34, the height of the silicide layer 12 is included in the height of the select gate electrode 34. Likewise, a reference character H3 denotes a height from the surface of the semiconductor substrate 1 to a surface of the memory gate electrode 36.

Based on the nonvolatile semiconductor memory device according to the first example, there is provided a difference between the height of the select gate electrode 34 and that of the memory gate electrode 36 to satisfy the following formula:

$$H2 \geq H1 + H3 \qquad \text{Formula (1)}$$

Since there is a difference between the height of the select gate electrode 34 and that of the memory gate electrode 36 as shown in formula (I), as will be described in detail later, the memory gate electrode 36 can be formed adjacent to the select gate electrode 34 without leaving any residue on side walls of the trenches 18.

In addition, if the height of the select gate electrode 34 and that of the memory gate electrode 36 are approximately the same, the silicide layers 12 formed on top of these gate electrodes may come into contact with each other. However, by forming the select gate electrode 34 and the memory cell gate electrode 36 to have a difference in height satisfying the above formula (1), even when the silicide layer 12 is formed on the surface of each of the select gate electrode 34 and the memory cell gate electrode 36, since the height of the select gate electrode 34 and that of the memory cell gate electrode 36 are sufficiently different, the silicide layers 12 do not come into contact with each other.

SECOND EXAMPLE

FIG. 4A is a cross section of a nonvolatile semiconductor memory device according to a second example, taken along line B-B' of FIG. 4B, and FIG. 4B is a plan view of the nonvolatile semiconductor memory device. FIGS. 5A to 5C illustrate cross sections of the nonvolatile semiconductor memory device, taken along lines A-A', C-C', and D-D' of FIG. 4B.

In the second example, a silicon dioxide film 21 and a silicon nitride film 22 are formed on top of the select gate electrode 34. These silicon dioxide film 21 and silicon nitride film 22 serve as dummy layers for the select gate electrode 34 when the memory gate electrode 36 is formed adjacent to the select gate electrode 34. Other configurations of the second example are the same as those of the first example.

FIG. 6 illustrates a relationship between a height of a surface of the select gate electrode, which includes the heights of the dummy layers 21 and 22, a height of a surface of the memory gate electrode, and a depth of a surface of the insulation layer formed on the bottom surface of the trenches 18. When compared with the relationship between the heights of the gate electrodes and the depth of the trenches 18 according to the first example shown in FIG. 3, it can be seen that the height of the select gate electrode 34 according to the second example includes the heights of the dummy layers 21 and 22 formed on top of the select gate electrode 34. Other configurations of the second example are the same as those of the first example, and the above formula (1) concerning the heights shown in the first example holds true for the second example. The reason why the height of the select gate electrode 34 includes the heights of the dummy layers 21 and 22 in the second example is that the memory gate electrode 36 can be formed adjacent to a side wall of the select gate electrode 34 and the dummy layers 21 and 22.

THIRD EXAMPLE

Next, a manufacturing method of the nonvolatile semiconductor memory device according to the above first example will be described with reference to FIGS. 7 to 24. Processes of a manufacturing method according to a third example will be described in sequence with reference to FIGS. 7 to 23, and FIG. 24 illustrates a height of a second gate electrode formed in a process shown in FIG. 13. FIGS. 7A to 7C to FIG. 23A to 23C are cross sections of the nonvolatile semiconductor memory device according to the first example, taken along the lines A-A', B-B', and C-C' of FIG. 1B.

Figure 10A:
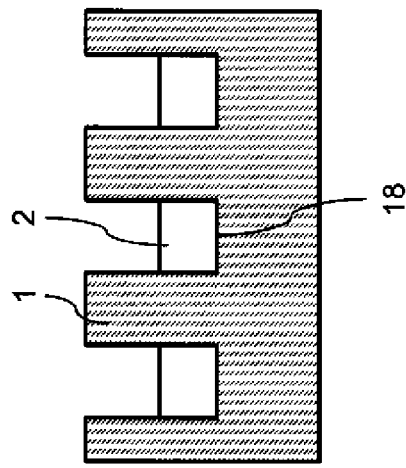
FIGS. 10A to 10C illustrate cross sections of the nonvolatile semiconductor memory device according to the first example of the present invention in a manufacturing process continuous from FIGS. 9A to 9C based on the manufacturing method according to the third example, taken along the lines A-A', B-B', and C-C'.
Figure 10B:
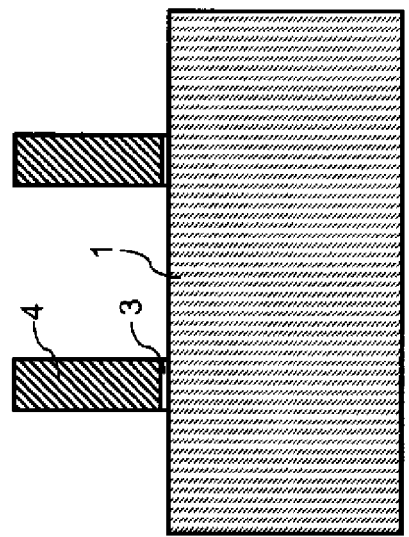
Figure 10C:
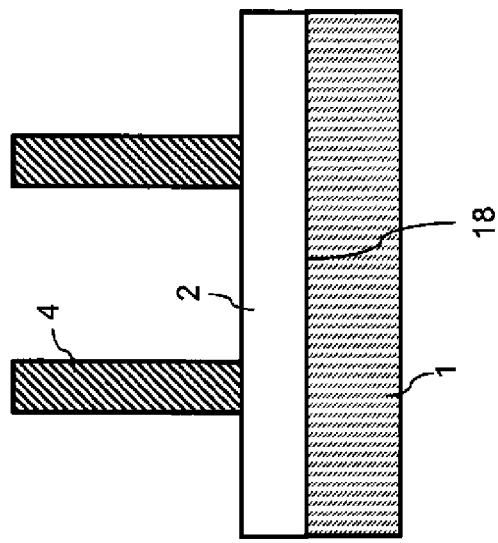

First, a STI 2 is formed on the surface of the semiconductor substrate 1 by a known process (FIG. 7). Preferably, the semiconductor substrate 1 is a silicon substrate. Next, the STI 2 at the memory cell portions is dug down (FIG. 8), and a thin silicon dioxide film 3 is formed on the surface of the semiconductor substrate 1. The silicon dioxide film 3 will serve as select gate electrode insulating layers. Next, a polysilicon 4 is deposited on the silicon dioxide film 3 (FIG. 9). The polysilicon 4 is formed to have a sufficient thickness, so that the select gate electrodes 34 with a sufficient height can be formed as will be described later. Next, patterning is carried out on the polysilicon 4 to shape the gate insulating film 3 and the select gate electrodes 34 (FIG. 10). During the patterning, as shown in FIG. 10A, all the polysilicon 4 in the trenches 18 formed by digging down the STI 2 needs to be removed. Next, an ONO film 5, which is formed by layers of a silicon dioxide film, a silicon nitride film, and a silicon dioxide film, is formed to cover semiconductor substrate 1 and the select gate electrodes 34 (FIG. 11). The silicon nitride film included in the ONO film 5 is a film that serves as a charge storage layer in the nonvolatile memory cell. Next, a polysilicon 6 with a certain thickness is formed as shown in FIG. 12.

Next, the polysilicon 6 is etched back as shown in FIG. 13 to form portions that will serve as the memory gate electrodes 36. During the etching, the polysilicon 6 that will not serve as the memory gate electrodes 36 needs to be removed to prevent adjacent memory gates electrodes 36 from forming a short circuit via the polysilicon 6 in the STI trenches 18. Since the trenches 18 are formed in the semiconductor substrate 1, the etch-back process needs to be carried out sufficiently, so that no residue remains on the side walls of the trenches. Thus, as shown in FIG. 24, a relationship between a height H3 of the memory gate electrodes 36 formed by this process, a height H2 of the select gate electrodes 34, and a depth H1 of the trenches 18 can be represented by the following formula:

$$H2 \geq H1 + H3 \qquad \text{formula (1)}$$

When the difference between the heights H2 and H3 is not sufficient, the polysilicon 6 may remain on side walls of the trenches 18 as a residue. Further, in order for the memory cell to function properly, the memory gate electrodes 36 need to have a sufficient height. Thus, in view of the depth H1 of the trenches 18 and the height H3 of the memory gate electrodes 36 formed in the above process, the select gate electrodes 34 with a sufficient height need to be formed in advance.

Figure 14C:
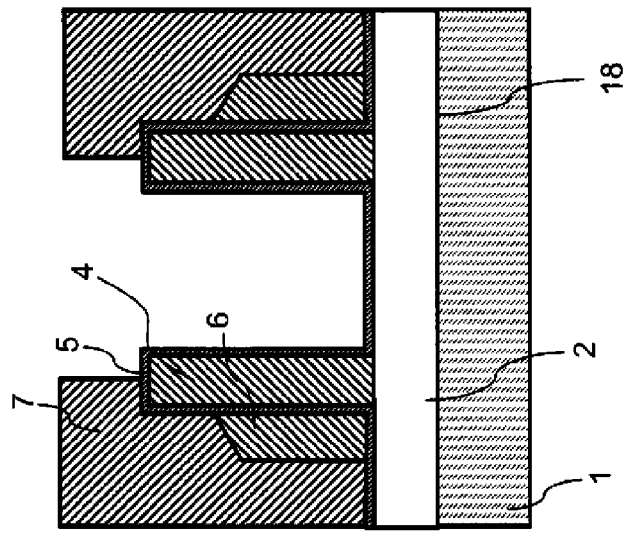
FIGS. 14A to 14C illustrate cross sections of the nonvolatile semiconductor memory device according to the first example of the present invention in a manufacturing process continuous from FIGS. 13A to 13C based on the manufacturing method according to the third example, taken along the lines A-A', B-B', and C-C'.
Figure 14B:
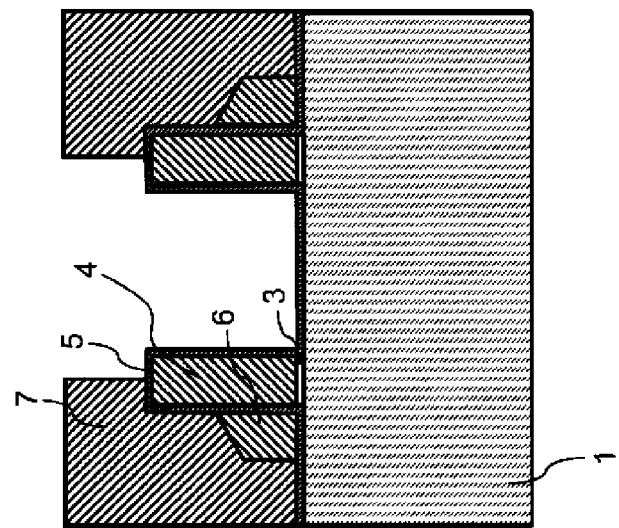
Figure 14A:
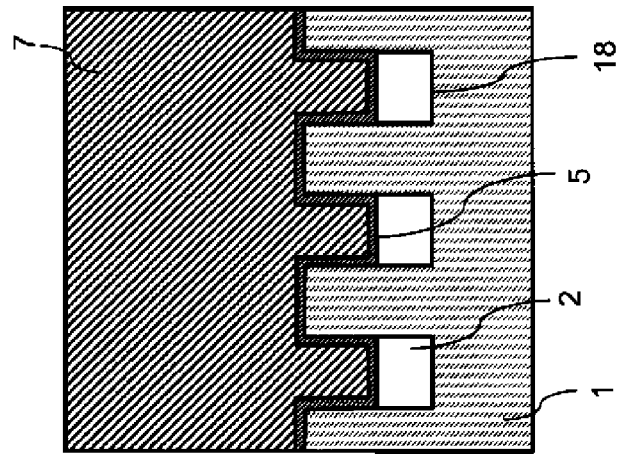
Figure 15C:
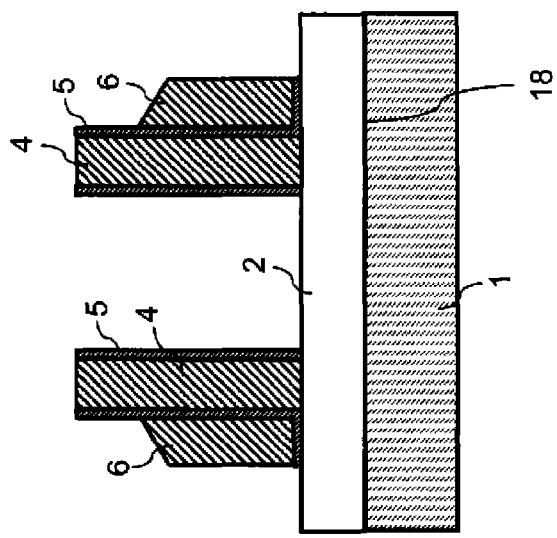
FIGS. 15A to 15C illustrate cross sections of the nonvolatile semiconductor memory device according to the first example of the present invention in a manufacturing process continuous from FIGS. 14A to 14C based on the manufacturing method according to the third example, taken along the lines A-A', B-B', and C-C'.
Figure 15B:
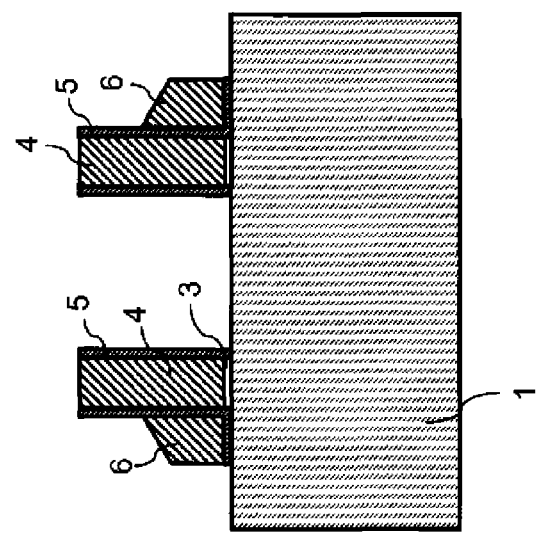
Figure 15A:
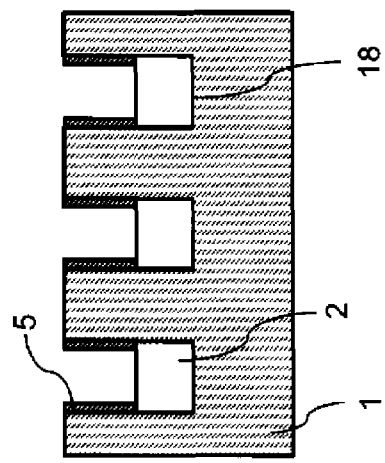
Figure 16C:
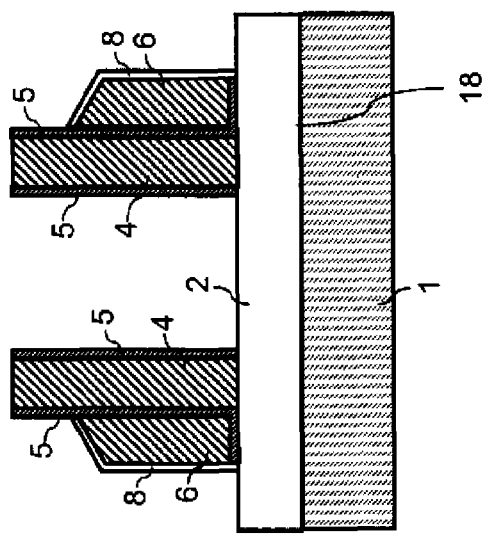
FIGS. 16A to 16C illustrate cross sections of the nonvolatile semiconductor memory device according to the first example of the present invention in a manufacturing process continuous from FIGS. 15A to 15C based on the manufacturing method according to the third example, taken along the lines A-A', B-B', and C-C'.
Figure 16B:
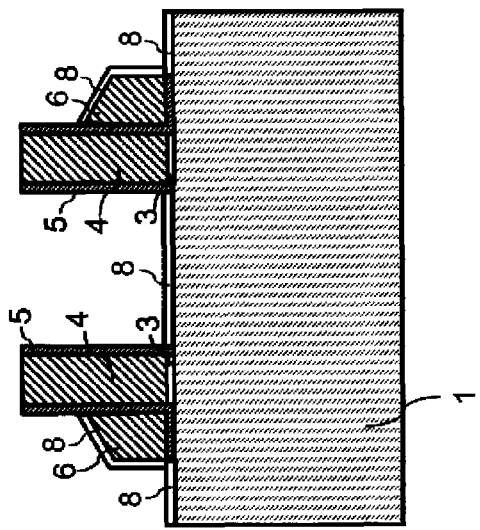
Figure 16A:
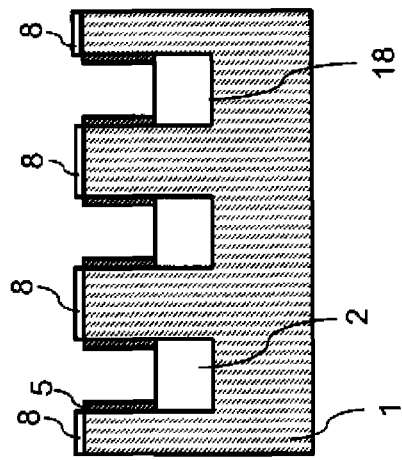
Figure 19C:
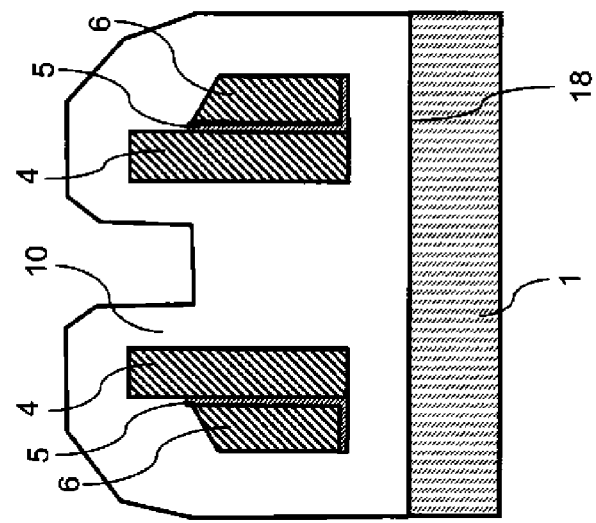
FIGS. 19A to 19C illustrate cross sections of the nonvolatile semiconductor memory device according to the first example of the present invention in a manufacturing process continuous from FIGS. 18A to 18C based on the manufacturing method according to the third example, taken along the lines A-A', B-B', and C-C'.
Figure 19B:
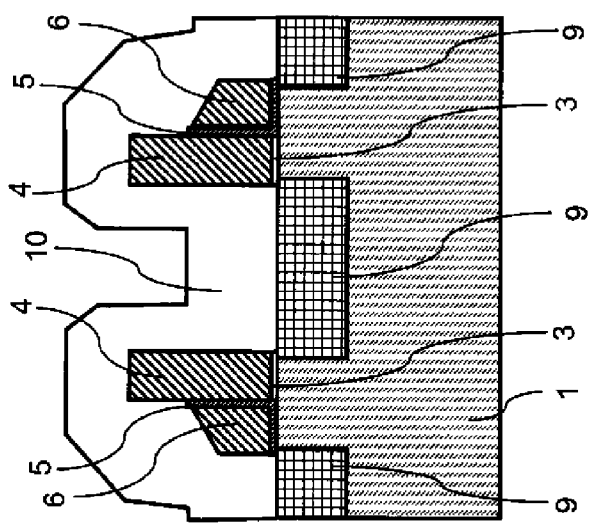
Figure 19A:
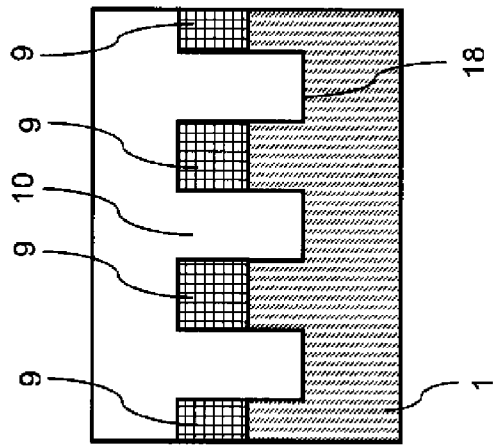
Figure 22C:
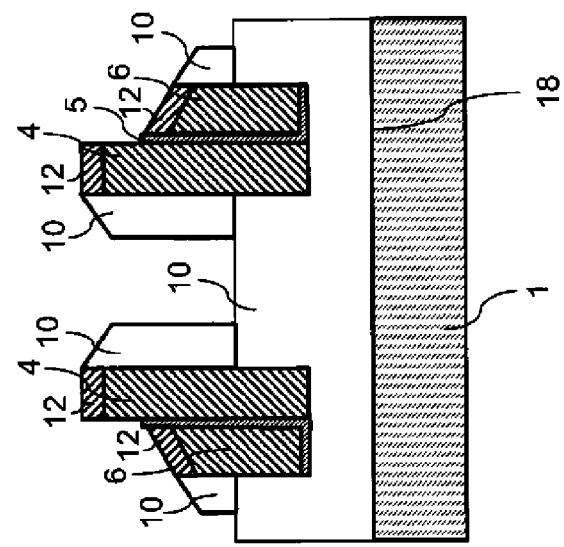
FIGS. 22A to 22C illustrate cross sections of the nonvolatile semiconductor memory device according to the first example of the present invention in a manufacturing process continuous from FIGS. 21A to 21C based on the manufacturing method according to the third example, taken along the lines A-A', B-B', and C-C'.
Figure 22B:
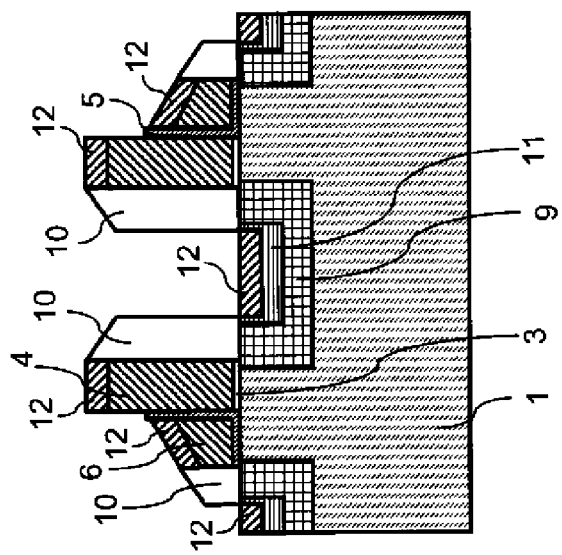
Figure 22A:
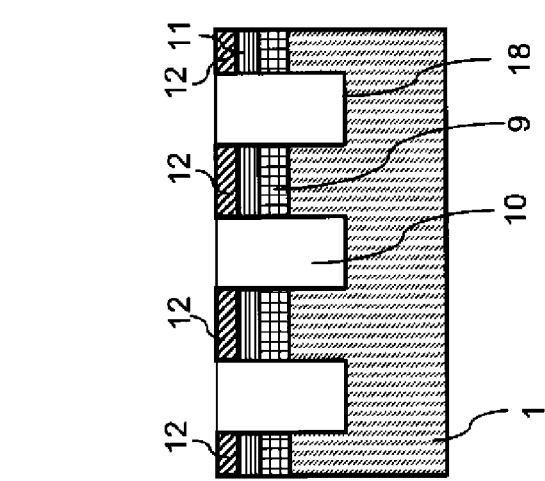
Figure 23C:
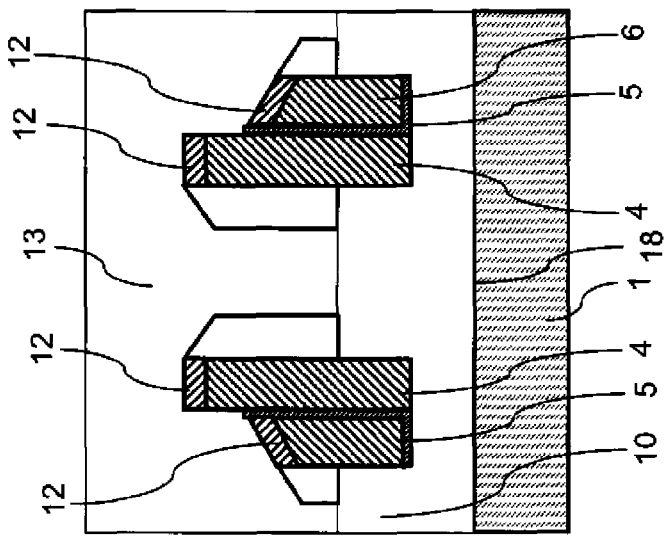
FIGS. 23A to 23C illustrate cross sections of the nonvolatile semiconductor memory device according to the first example of the present invention in a manufacturing process continuous from FIGS. 22A to 22C based on the manufacturing method according to the third example, taken along the lines A-A', B-B', and C-C'.
Figure 23B:
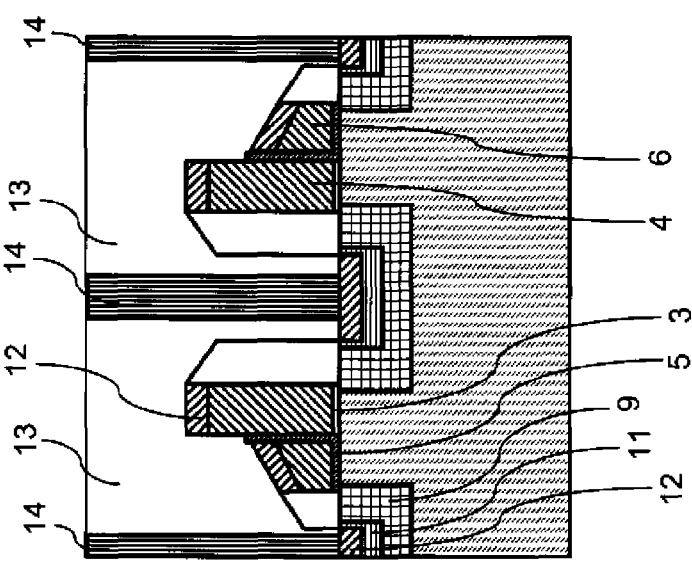
Figure 23A:
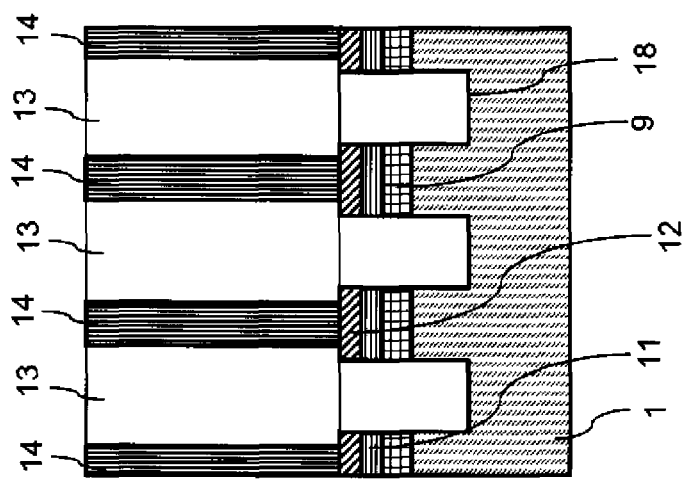

Next, while the polysilicon 6 has so far been formed on both sides of each select gate electrode 34, the polysilicon 6 on one of the sides that needs to remain and serves as the memory gate electrode 36 is covered with a resist 7, and the polysilicon 6 that is not covered with the resist 7 on the other side is removed, as shown in FIG. 14. Next, the ONO film 5 formed on the even surface of the semiconductor substrate 1 is removed by dry etching (FIG. 15). Next, while oxidation is carried out as shown in FIG. 16, almost no oxide film is formed on the surface of the nitride films. Next, by wet etching, the nitride films on the side walls are removed (FIG. 17). As shown in FIG. 18, to form LDD regions 9, the semiconductor substrate 1 is implanted with an impurity such as arsenic. Next, an insulating film 10 is allowed to grow, so that side walls can be formed later (FIG. 19). This insulating film (silicon dioxide film) 10 may include a nitride film. Next, the insulating film 10 is etched back to form side walls on the side walls of the polysilicons 4 and 6 which will serve as the select and memory gate electrodes 34 and 36, respectively (FIG. 20). Next, the LDD regions 9 are implanted with an impurity such as arsenic to form diffusion layers 11 that serve as source/drain regions (FIG. 21). Next, NiSi that serves as silicide layers 12 is formed on the surface of the diffusion layer 11 and the surface of each of the polysilicons 4 and 6 (FIG. 22). Next, an interlayer film 13 and contact holes 14 are formed (FIG. 23). Finally, metal wirings 15 are formed by a know process. Thus, a nonvolatile semiconductor memory device having the structure shown in FIGS. 1 and 2 can be made.

While the ONO film 5 is etched in two separate processes shown in FIGS. 14 to 17 of the third example, the silicon dioxide film may be etched in the state shown in FIG. 14 to remove the silicon dioxide film in the upper portion of the ONO film 5.

FOURTH EXAMPLE

Next, a manufacturing method of the nonvolatile semiconductor memory device according to the above second example will be described with reference to FIGS. 25 to 40. Processes of a manufacturing method according to a fourth example will be described in sequence with reference to FIGS. 25 to 39, and FIG. 40 illustrates a height of a second gate electrode formed in a process shown in FIG. 29. FIGS. 25A to 25C to FIGS. 39A to 39C illustrate cross sections of the nonvolatile semiconductor memory device according to the second example, taken along the lines A-A', B-B', and C-C' of FIG. 4B. The third and fourth examples are the same until the manufacturing processes shown in FIG. 8. Thus, manufacturing processes after that shown in FIG. 8 of the third example will be hereinafter described.

Figure 26C:
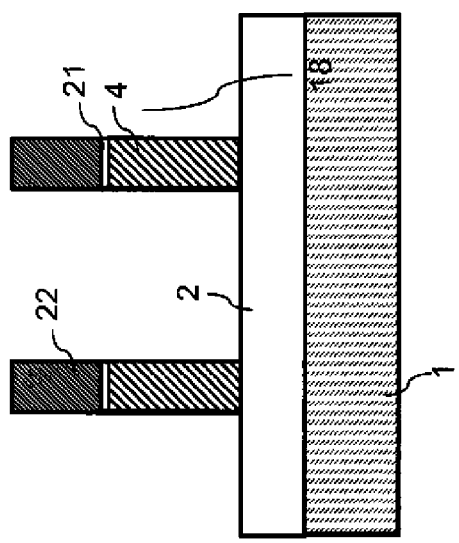
FIGS. 26A to 26C illustrate cross sections of the nonvolatile semiconductor memory device according to the second example of the present invention in a manufacturing process continuous from FIGS. 25A to 25C based on the manufacturing method according to the fourth example, taken along the lines A-A', B-B', and C-C'.
Figure 26B:
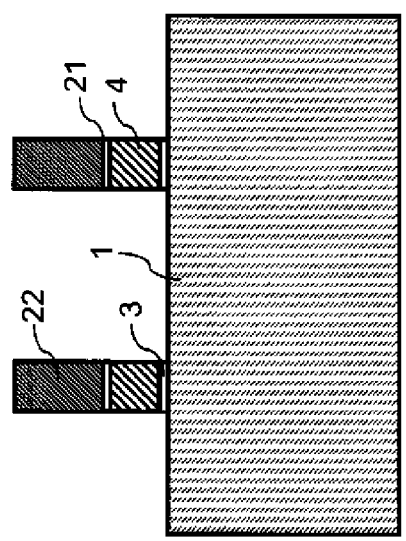
Figure 26A:
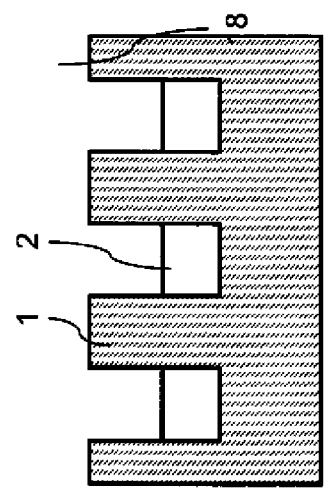
Figure 28C:
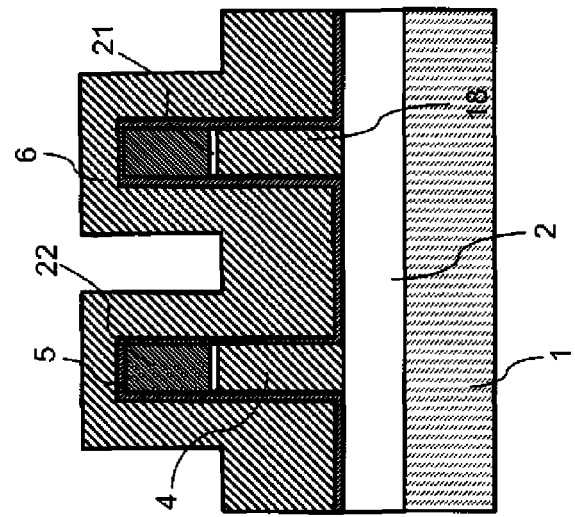
FIGS. 28A to 28C illustrate cross sections of the nonvolatile semiconductor memory device according to the second example of the present invention in a manufacturing process continuous from FIGS. 27A to 27C based on the manufacturing method according to the fourth example, taken along the lines A-A', B-B', and C-C'.
Figure 28B:
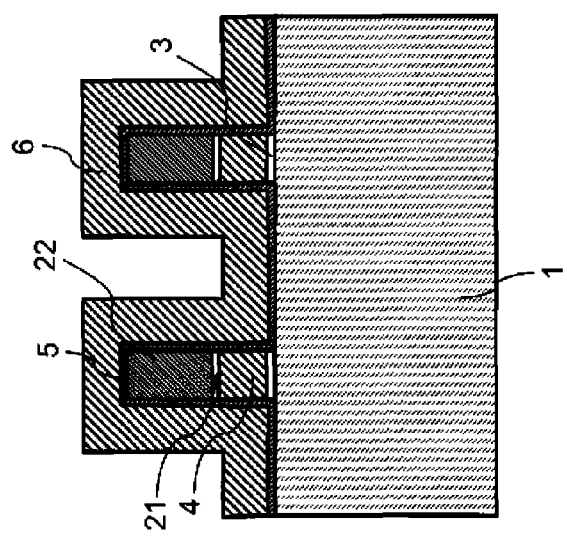
Figure 28A:
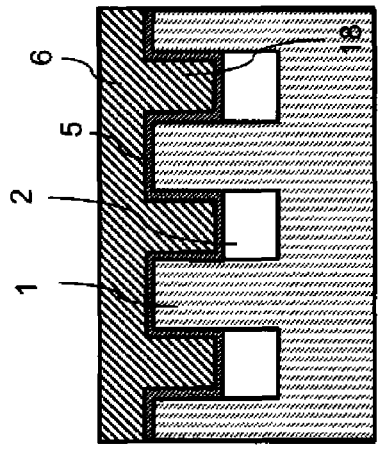
Figure 31A:
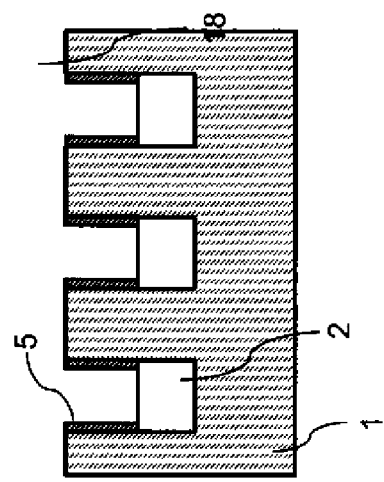
FIGS. 31A to 31C illustrate cross sections of the nonvolatile semiconductor memory device according to the second example of the present invention in a manufacturing process continuous from FIGS. 30A to 30C based on the manufacturing method according to the fourth example, taken along the lines A-A', B-B', and C-C'.
Figure 31B:
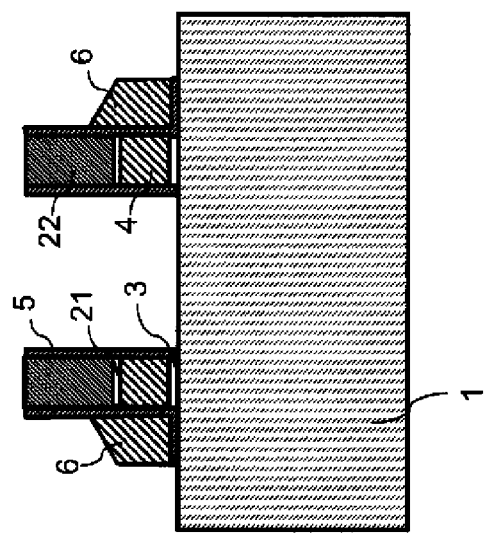
Figure 31C:
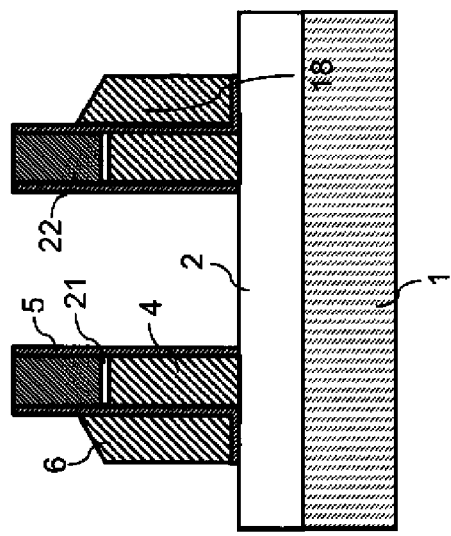
Figure 33C:
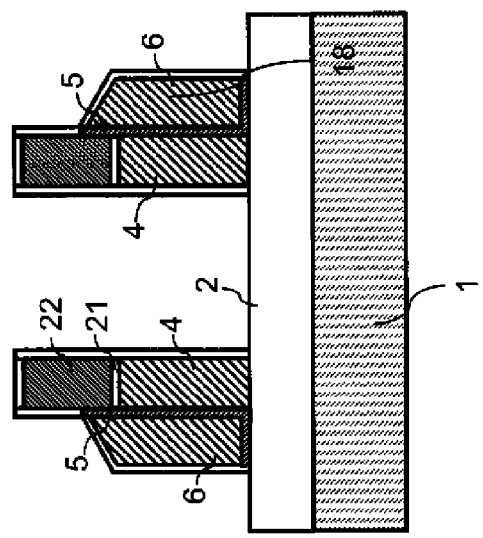
FIGS. 33A to 33C illustrate cross sections of the nonvolatile semiconductor memory device according to the second example of the present invention in a manufacturing process continuous from FIGS. 32A to 32C based on the manufacturing method according to the fourth example, taken along the lines A-A', B-B', and C-C'.
Figure 33B:
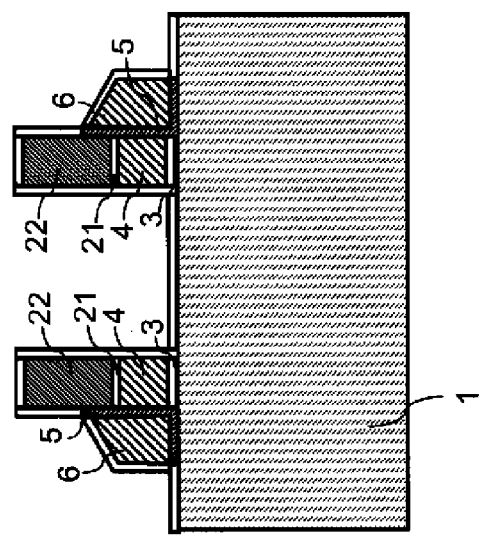
Figure 33A:
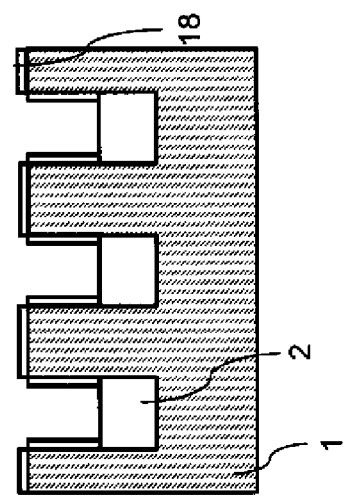
Figure 34C:
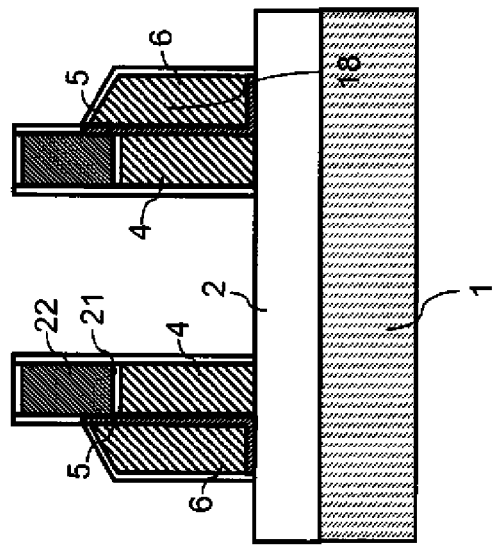
FIGS. 34A to 34C illustrate cross sections of the nonvolatile semiconductor memory device according to the second example of the present invention in a manufacturing process continuous from FIGS. 33A to 33C based on the manufacturing method according to the fourth example, taken along the lines A-A', B-B', and C-C'.
Figure 34B:
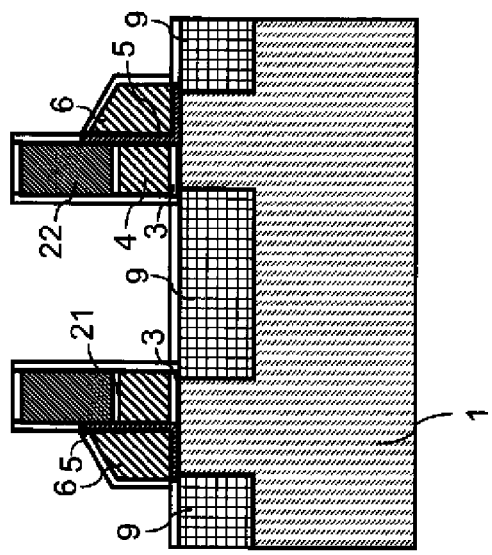
Figure 34A:
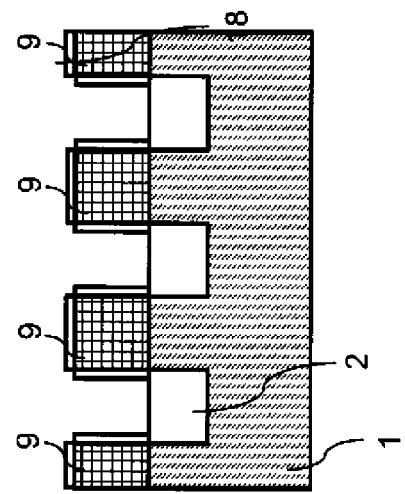
Figure 35C:
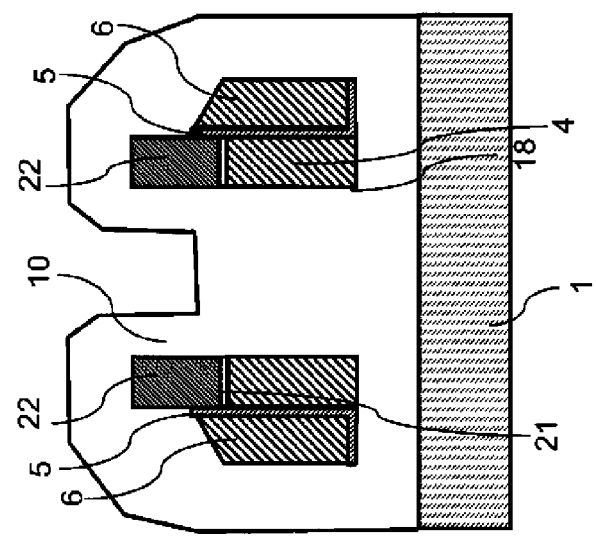
FIGS. 35A to 35C illustrate cross sections of the nonvolatile semiconductor memory device according to the second example of the present invention in a manufacturing process continuous from FIGS. 34A to 34C based on the manufacturing method according to the fourth example, taken along the lines A-A', B-B', and C-C'.
Figure 35B:
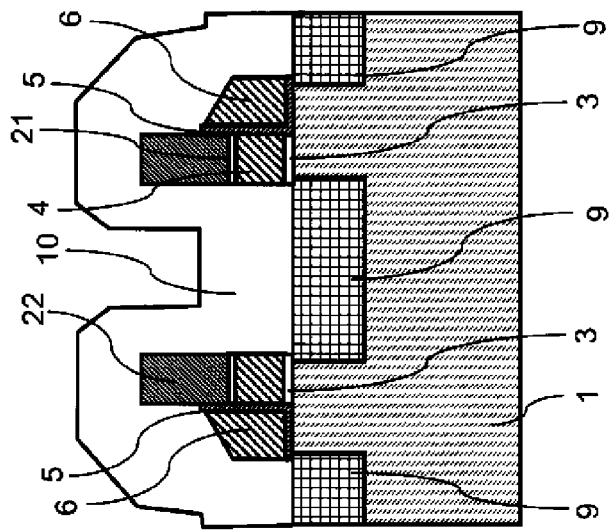
Figure 35A:
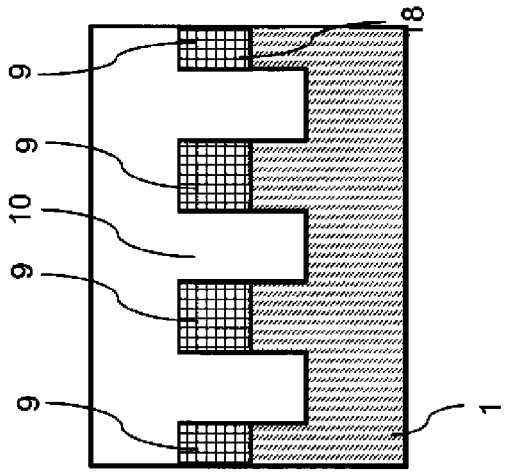
Figure 38C:
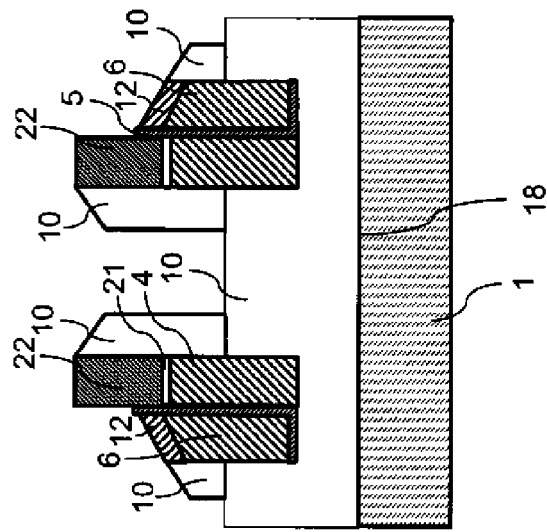
FIGS. 38A to 38C illustrate cross sections of the nonvolatile semiconductor memory device according to the second example of the present invention in a manufacturing process continuous from FIGS. 37A to 37C based on the manufacturing method according to the fourth example, taken along the lines A-A', B-B', and C-C'.
Figure 38B:
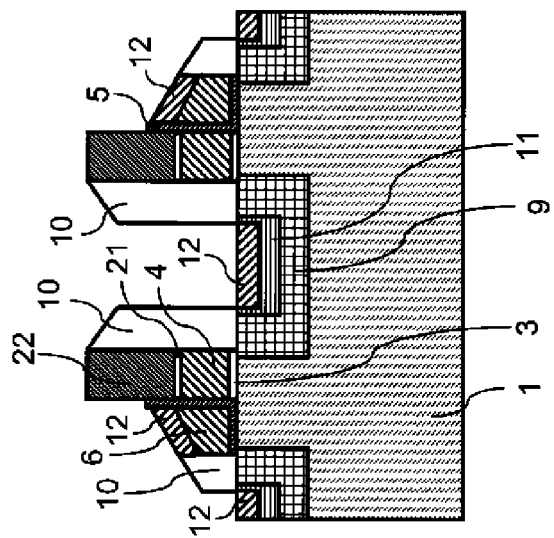
Figure 38A:
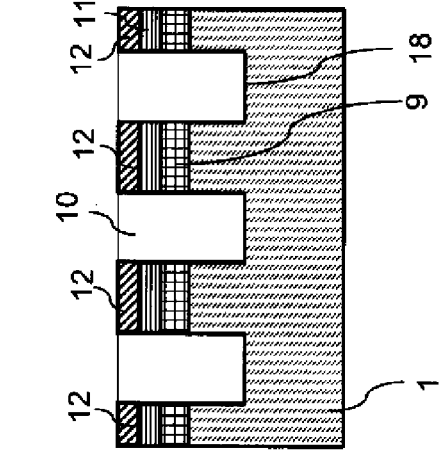
Figure 39C:
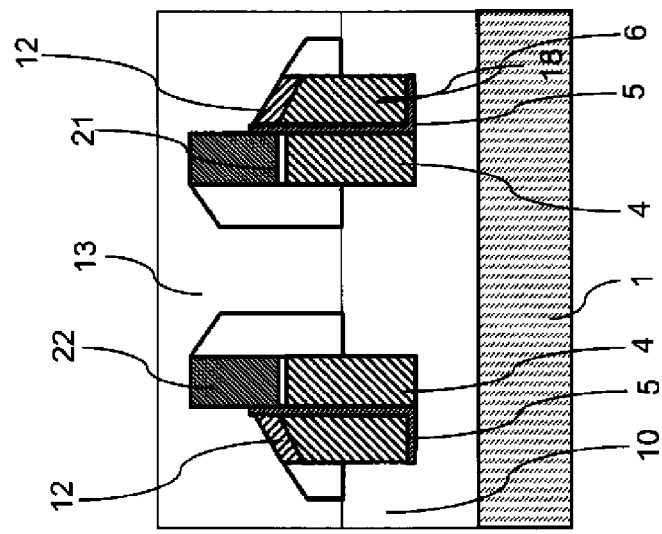
FIGS. 39A to 39C illustrate cross sections of the nonvolatile semiconductor memory device according to the second example of the present invention in a manufacturing process continuous from FIGS. 38A to 38C based on the manufacturing method according to the fourth example, taken along the lines A-A', B-B', and C-C'.
Figure 39B:
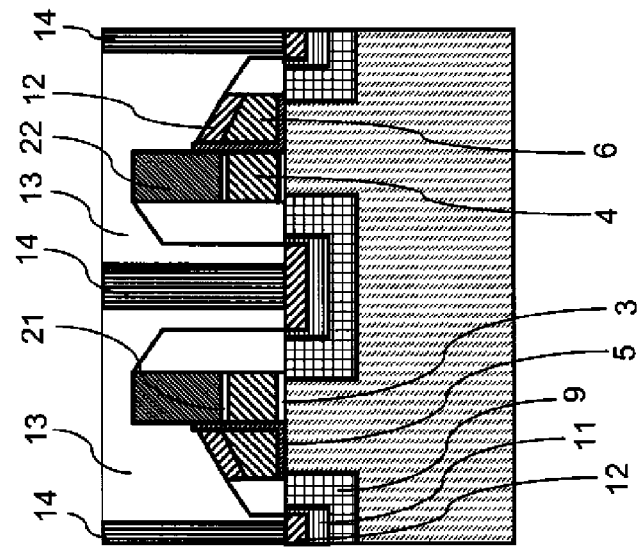
Figure 39A:
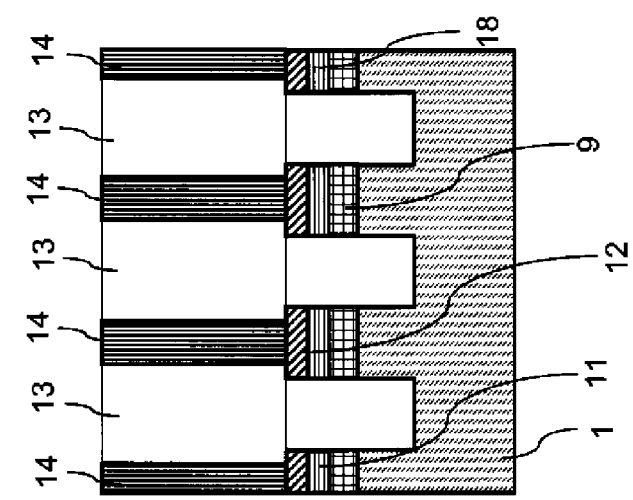

After the STI 2 at the memory cell portions is dug down in the process of FIG. 8, a thin silicon dioxide film 3 is formed as shown in FIG. 25. Further, a polysilicon 4, a silicon dioxide film 21, and a silicon nitride film 22 are deposited in this order. Since these silicon dioxide film 21 and silicon nitride film 22 will serve as dummy layers later, the silicon nitride film 22 with a sufficient thickness needs to be formed. Next, patterning is carried out to shape the gate insulating film 3, the polysilicon 4 which will serve as the select gate electrodes 34, and the silicon dioxide film 21 and the silicon nitride film 22, which will serve as dummy layers, to form select gate electrode portions (FIG. 26). During the patterning, as shown in FIG. 26A, all the polysilicon 4 in the trenches 18 formed by digging down the STI 2 needs to be removed. The subsequent processes are basically the same as those in the manufacturing method according to the third example. However, the fourth example differs from the third example in that the silicon dioxide film 21 and the silicon nitride film 22 form dummy layers on top of each select gate electrode 34. Since the silicon dioxide film 21 and the silicon nitride film 22 are made of insulating material, electrically, these films do not serve as electrodes. However the films 21 and 22 serve as side walls to support the memory gate electrodes 36, and thus, in this respect, the films 21 and 22 serve the same structural function as the select gate electrodes 34. As shown in FIG. 40, the fourth example is the same as the third example in that the select gate electrodes 34 with a sufficient height need to be formed to satisfy the above formula (1). In the fourth example, as described above, the height H2 of the select gate electrodes 34 includes the heights of the dummy layers.

FIFTH EXAMPLE

Next, a nonvolatile semiconductor memory device manufacturing method according to a fifth example will be described. The manufacturing method according to the fifth example can also prevent a residue from remaining on the side walls of the trenches provided on the surface of the semiconductor substrate and can provide high-speed and highly-integrated nonvolatile semiconductor memory devices which can be used for purposes that require high reliability.

Figure 48A:
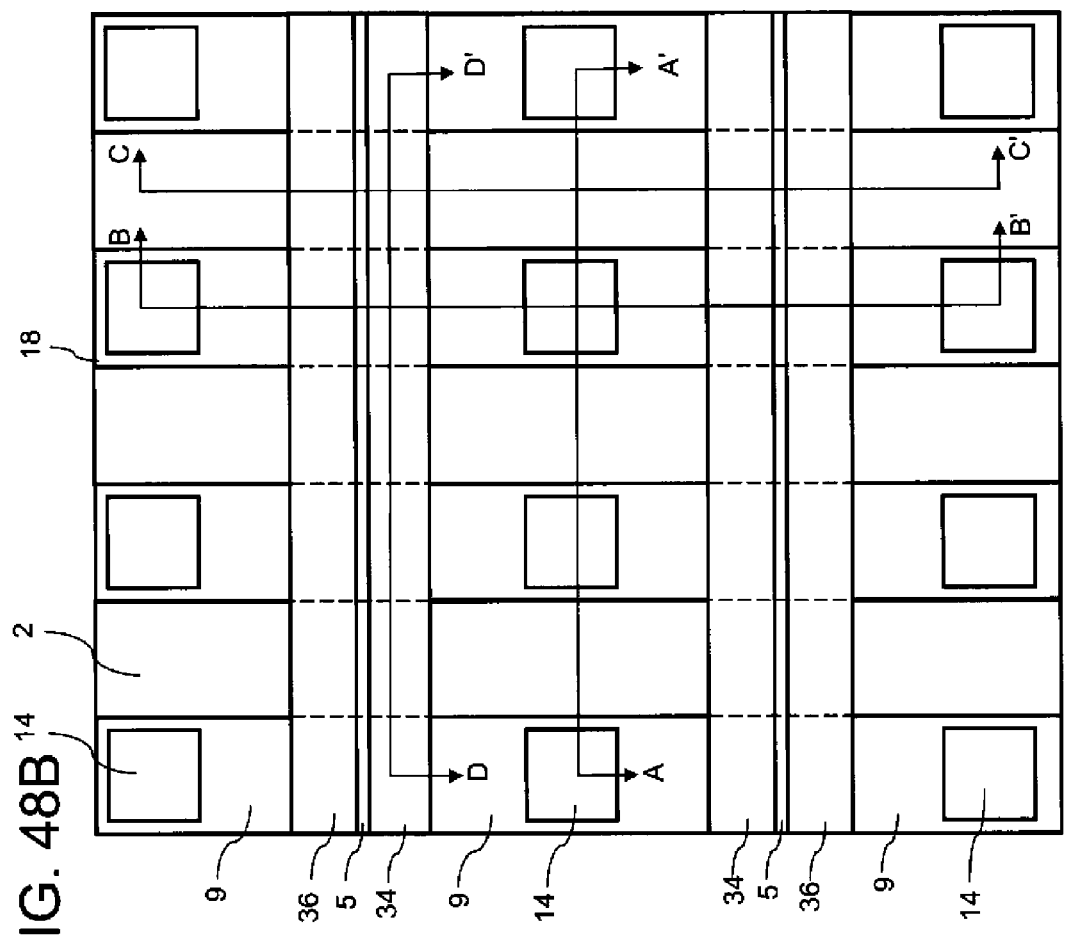
FIG. 48A illustrates a cross section of the nonvolatile semiconductor memory device manufactured by the manufacturing method according to the sixth example of the present invention, taken along line B-B' of FIG. 48B.
Figure 48B:
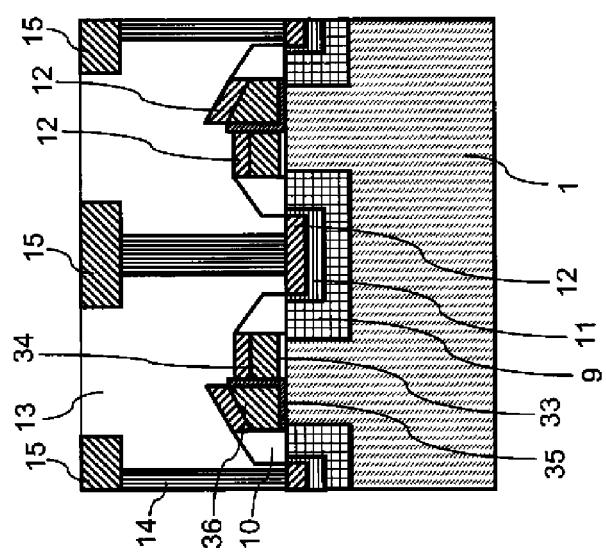
FIG. 48B is a plan view of the nonvolatile semiconductor memory device.

FIGS. 41 to 47 illustrate cross sections of a nonvolatile semiconductor memory device in manufacturing processes of the manufacturing method according to the fifth example. FIGS. 48 and 49 illustrate a plan view and cross sections of the nonvolatile semiconductor memory device manufactured by the manufacturing method according to the fifth example.

Figure 41C:
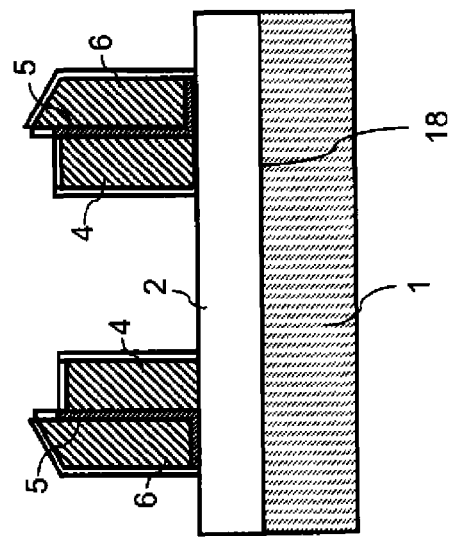
FIGS. 41A to 41C illustrate cross sections of a nonvolatile semiconductor memory device according to another example (fifth example) of the present invention in a manufacturing process based on a manufacturing method, termed as a sixth example, taken along the lines A-A', B-B', and C-C' of FIG. 48B, respectively.
Figure 41B:
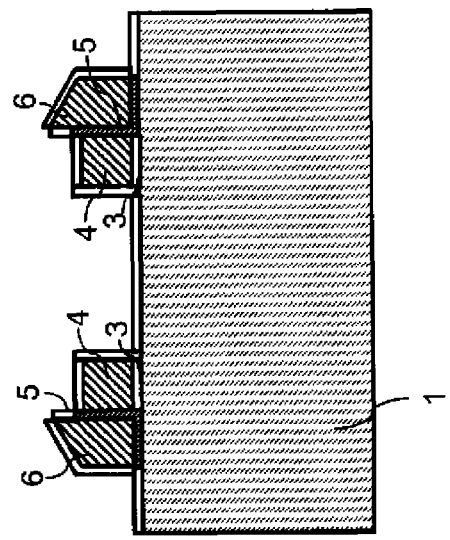
Figure 41A:
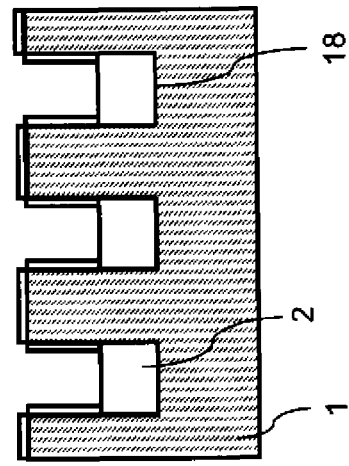
Figure 42A:
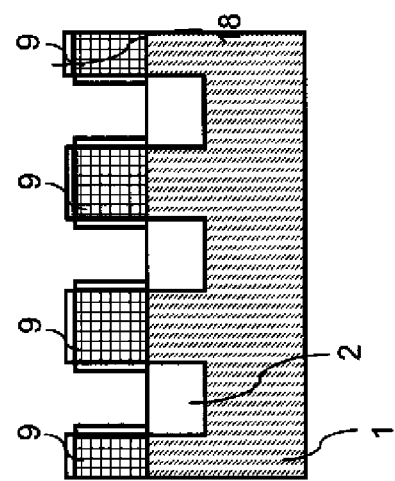
FIGS. 42A to 42C illustrate cross sections of the nonvolatile semiconductor memory device according to the fifth example of the present invention in a manufacturing process, which is continuous from FIGS. 39A to 39C, based on the manufacturing method according to the sixth example, taken along the lines A-A', B-B', and C-C'.
Figure 42B:
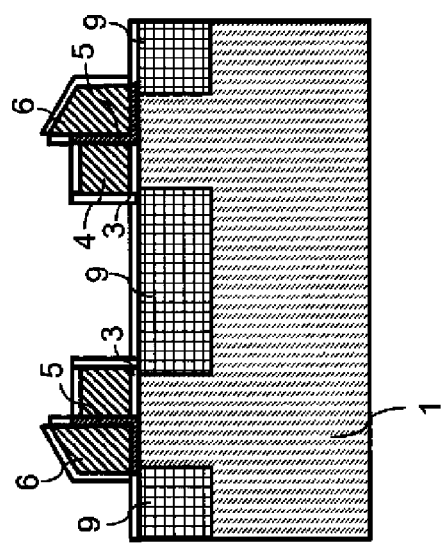
Figure 42C:
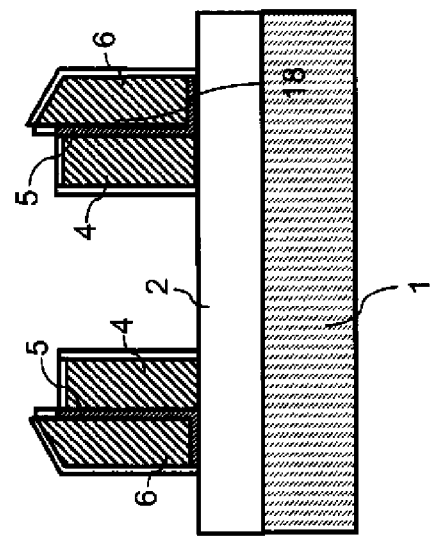
Figure 43C:
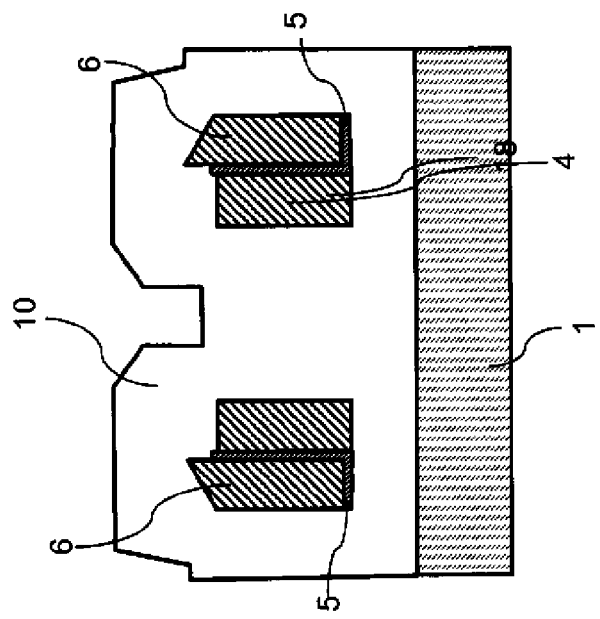
FIGS. 43A to 43C illustrate cross sections of the nonvolatile semiconductor memory device according to the fifth example of the present invention in a manufacturing process continuous from FIGS. 40A to 40C based on the manufacturing method according to the sixth example, taken along the lines A-A', B-B', and C-C'.
Figure 43B:
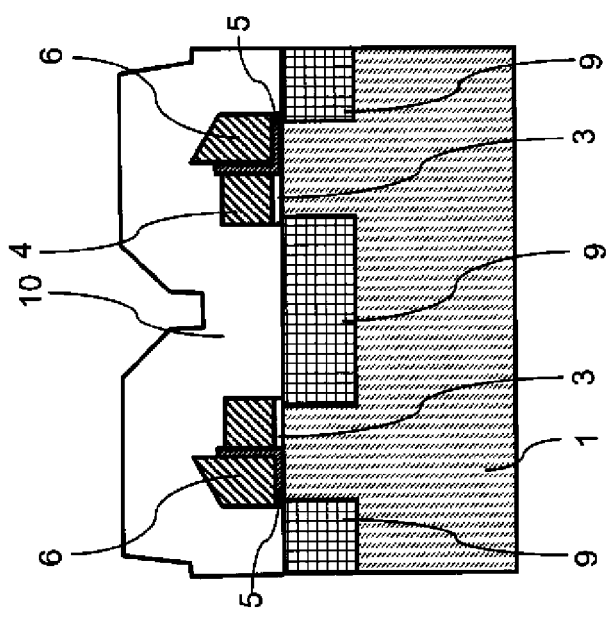
Figure 43A:
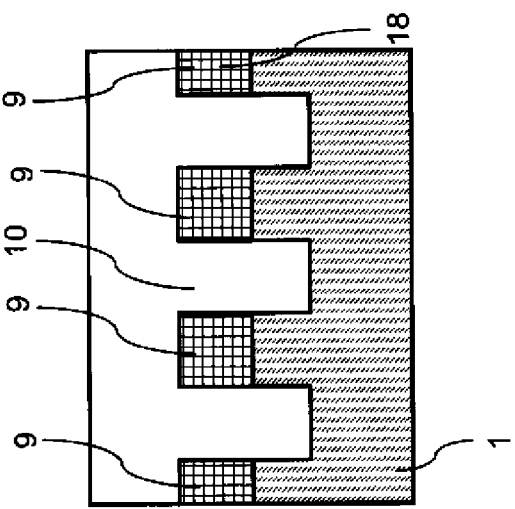
Figure 44C:
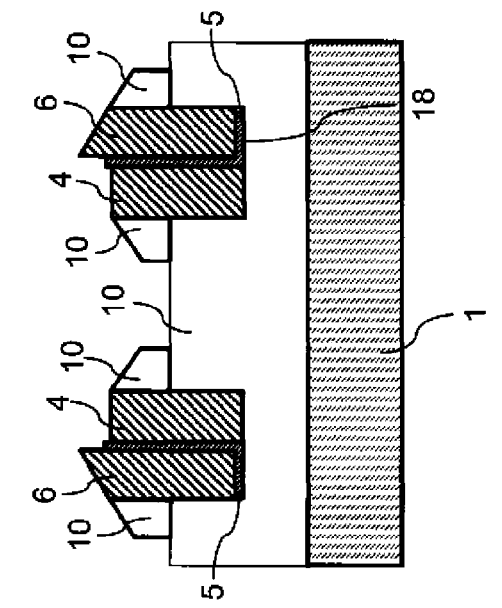
FIGS. 44A to 44C illustrate cross sections of the nonvolatile semiconductor memory device according to the fifth example of the present invention in a manufacturing process continuous from FIGS. 41A to 41C based on the manufacturing method according to the sixth example, taken along the lines A-A', B-B', and C-C'.
Figure 44B:
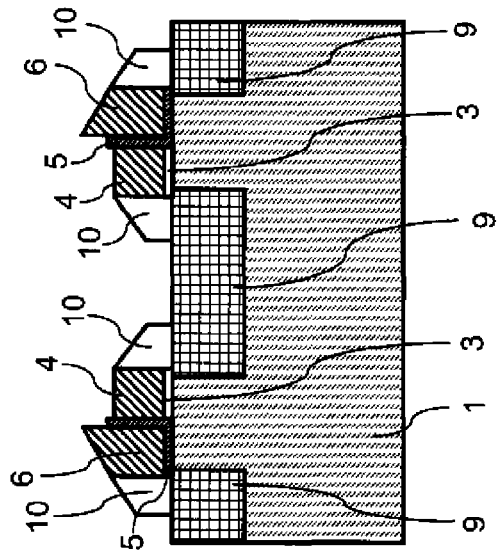
Figure 44A:
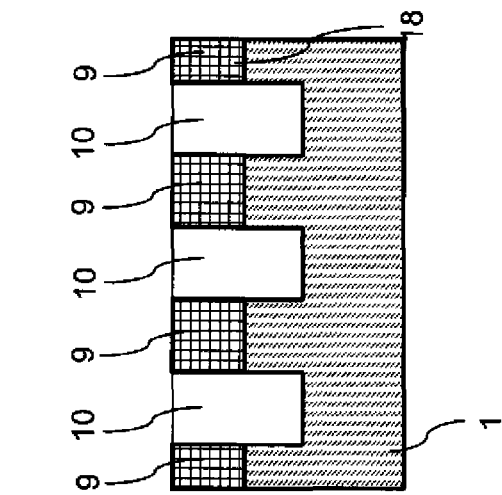

The fourth and fifth examples are the same until the process shown in FIG. 32. In FIG. 41, after the second gate electrodes are formed, the silicon nitride film 22 that serves as a dummy layer on top of each first gate electrode 34 is removed by wet etching. The subsequent processes of the fifth example are basically the same as those of the third and fourth examples. In the fifth example, after the dummy layers are removed, the height of the select gate electrodes 34 is less than the height of the memory gate electrodes 36. If the memory gate electrodes 36 and the select gate electrodes 34 have an approximately equal height, when the silicide layer 12 is formed on the surface of each of the gate electrodes 34 and 36, a short circuit may be formed. Thus, after the dummy layers are removed, the height of the select gate electrodes 34 and the height of the memory gate electrodes 36 need to be different from each other. For this reason, the height of the memory gate electrodes 36 may be less than the height of the select gate electrodes 34. Therefore, since there is created a substantial difference in height between the select gate electrodes 34 and the memory gate electrodes 36, after the silicide layer 12 is formed on the surface of each of the gate electrodes 34 and 36, a short-circuit can be prevented.

Since the silicide layer 12 can be formed on the surface of each of the select gate electrodes 34 and the memory gate electrodes 36 according to the fifth example, resistance of the select gate electrodes 34 and the memory gate electrodes 36 can be reduced. In addition, since the select gate electrodes 34 and the memory gate electrodes 36 with a relatively low height can be formed, the height of the contacts 14 formed in the silicon dioxide film 13 which serves as an interlayer insulating film can be reduced, and as a result, the metal wirings 15 can be formed at a low height.

SIXTH EXAMPLE

Various variations can be made to the structure of the nonvolatile semiconductor memory device according to the above first and second examples and to the nonvolatile semiconductor memory device manufacturing method according to the third to fifth examples. For example, as shown in FIG. 50, the memory gate electrodes 36 may be formed first, and the select gate electrodes 34 may be formed adjacent to side walls of the memory gate electrodes 36. In this case, the ONO film 5 is deposited in the process shown in FIG. 9, instead of the silicon dioxide film 3, and the silicon dioxide film 3 is deposited in the process shown in FIG. 11, instead of the ONO film 5. Other manufacturing processes are basically the same as those in the third example, except that processes for removing the ONO film 5 and the silicon dioxide film 3 are slightly different. In FIG. 50, the memory gate electrodes 36 are formed to have a height greater than that of the select gate electrodes 34.

Further, as in the manufacturing method according to the second example, the silicon dioxide film 21 and the silicon nitride film 22 may be formed as dummy layers on top of each of the memory gate electrodes 36, as a variation of the sixth example. Further, as in the manufacturing method according to the fifth example, after the select gate electrodes 34 are formed, the dummy layers 21 and 22 formed on top of the memory gate electrodes 36 may be removed.

SEVENTH EXAMPLE

FIGS. 51A to 51C illustrate cross sections and a plan view of a nonvolatile semiconductor memory device according to a seventh example. FIGS. 51A and 51B illustrate cross sections taken along lines B-B' and C-C' of FIG. 51C. All the reference characters shown in FIG. 51 are the same as those shown in figures in the first to sixth examples. In FIG. 51, each select gate electrode 34 is formed in the center, and the memory gate electrodes 36 are formed on both sides of the select gate electrode 34. Based on this configuration shown in FIG. 51, since a single memory cell includes a plurality of memory gates, a multivalued memory can be formed. Since the configuration of such multivalued memory is known, detailed description thereof is omitted herein. The memory cell shown in FIG. 51 can be manufactured by omitting the process shown in FIG. 14. Namely, the polysilicon 6 on both sides will serve as the memory cell electrodes 36 in this example. According to the seventh example shown in FIG. 51, as in the second example, the dummy layers may be formed on top of the select gate electrodes 34. Further, as in the manufacturing method according to example 5, dummy layers on top of the select gate electrodes 34 may be removed after the memory gate electrodes 36 are formed.

While the present invention has thus been described based on examples, the present invention is not limited to the above examples. Needless to say, the invention includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A nonvolatile semiconductor memory device comprising:
   a semiconductor substrate having a plurality of trenches in parallel with each other on a surface of the semiconductor substrate;
   insulation layers each formed on a bottom surface of each of the plurality of trenches;
   a select gate electrode formed in a direction perpendicular to the plurality of trenches on the surface of the semiconductor substrate and side walls of the plurality of trenches via a first gate insulating film;
   a memory gate electrode formed on the surface of the semiconductor substrate and side walls of the plurality of trenches via a second gate insulating film formed of a multilayer film including a charge storage layer, the memory gate electrode formed adjacent to the select gate electrode via an insulating film in a direction perpendicular to the plurality of trenches; and
   source/drain regions each formed on the surface of the semiconductor substrate between each pair of the plurality of trenches and sandwiching the select gate electrode and the memory gate electrode;

wherein a difference between a height of a surface of the select gate electrode and a height of a surface of the memory gate electrode is equal to or greater than a difference between a height of a surface of the insulation layers each formed on the bottom surface of each of the trenches and a height of a surface of the source drain regions.

2. The nonvolatile semiconductor memory device according to claim 1, wherein the height of the surface of the select gate electrode is greater than the height of the surface of the memory gate electrode, and the memory gate electrode is formed adjacent to a side wall of the select gate electrode.

3. The nonvolatile semiconductor memory device according to claim 2, wherein the memory gate electrode comprises first and second memory gate electrodes sandwiching the select gate electrode via the insulating film, and wherein each pair of the source/drain regions sandwiches the first memory gate electrode, the select gate electrode, and the second memory gate electrode and are formed adjacent to a side of the first memory gate electrode or the second memory gate electrode, the side being opposite to the select gate electrode.

4. The nonvolatile semiconductor memory device according to claim 2,
wherein, assuming that the memory gate electrode is a first memory gate electrode, a second memory gate electrode is formed adjacent to the first memory gate electrode via the select gate electrode,
wherein the second memory gate electrode is formed on the surface of the semiconductor substrate and side walls of the plurality of trenches via the second gate insulating film and formed adjacent to the select gate electrode via an insulating film in a direction perpendicular to the plurality of trenches, and
wherein each pair of the source drain regions sandwiches the first memory gate electrode, the select gate electrode, and the second memory gate electrode arranged in this order.

5. The nonvolatile semiconductor memory device according to claim 1, wherein the height of the surface of the memory gate electrode is greater than the height of the surface of the select gate electrode, and the select gate electrode is formed adjacent to a side wall of the memory gate electrode.

6. The nonvolatile semiconductor memory device according to claim 2, wherein dummy layers are formed on top of the select gate electrode, and the height of the surface of the select gate electrode includes heights of the dummy layers, and wherein the memory gate electrode is formed adjacent to a side wall of the select gate electrode of which height includes the heights of the dummy layers.

7. The nonvolatile semiconductor memory device according to claim 6, wherein the dummy layers comprise a silicon nitride film.

8. The nonvolatile semiconductor memory device according to claim 5, wherein dummy layers are formed on top of the memory gate electrode, the height of the surface of the memory gate electrode includes heights of the dummy layers, and the select gate electrode is formed adjacent to a side wall of the memory gate electrode of which height includes heights of the dummy layers.

9. The nonvolatile semiconductor memory device according to claim 1, wherein metal wirings are formed above the memory gate electrode and the select gate electrode via an interlayer insulating film that covers the surface of the semiconductor substrate, and wherein the source drain regions are connected to the metal wirings via contacts formed in the interlayer insulating film.

* * * * *